United States Patent
Yamazaki et al.

[11] Patent Number: 5,814,834
[45] Date of Patent: Sep. 29, 1998

[54] THIN FILM SEMICONDUCTOR DEVICE

[75] Inventors: Shunpei Yamazaki, Tokyo; Jun Koyama; Yasuhiko Takemura, both of Kanagawa, all of Japan

[73] Assignee: Semiconductor Energy Laboratory Co., Kanagawa-ken, Japan

[21] Appl. No.: 759,565

[22] Filed: Dec. 4, 1996

[30] Foreign Application Priority Data

Dec. 4, 1995 [JP] Japan .................................. 7-344496
Mar. 8, 1996 [JP] Japan .................................. 8-081014
Mar. 11, 1996 [JP] Japan .................................. 8-083150

[51] Int. Cl.$^6$ .................... H01L 31/036; H01L 29/04; H01L 27/01
[52] U.S. Cl. .................... 257/59; 257/65; 257/66; 257/71; 257/72; 257/347; 257/354
[58] Field of Search .................... 257/59, 66, 71, 257/72, 65, 347, 354

[56] References Cited

U.S. PATENT DOCUMENTS 5,606,179 2/1997 Yamazaki et al. .................... 257/59
5,656,824 8/1997 Den Boer et al. .................... 257/59
5,656,825 8/1997 Kusumoto et al. .................... 257/66

*Primary Examiner*—Valencia Wallace
*Attorney, Agent, or Firm*—Fish & Richardson P.C.

[57] ABSTRACT

A thin film semiconductor device includes a thin film semiconductor, a gate insulating film, and a gate electrode. The thin film semiconductor includes a source region of a first conductivity type connected to a source electrode/wiring, a drain region of the first conductivity connected to a drain electrode/wiring, a base region being intrinsic or having a conductivity type opposite to the first conductivity and disposed between the source region and the drain region, and a floating island region having the first conductivity type and divided from the source region and the drain region by the base region. The gate electrode is provided upper or under the base region through the gate insulating film. According to such a structure, an ON/OFF ratio of the thin film semiconductor device can be increased.

29 Claims, 28 Drawing Sheets

FIG. 3A
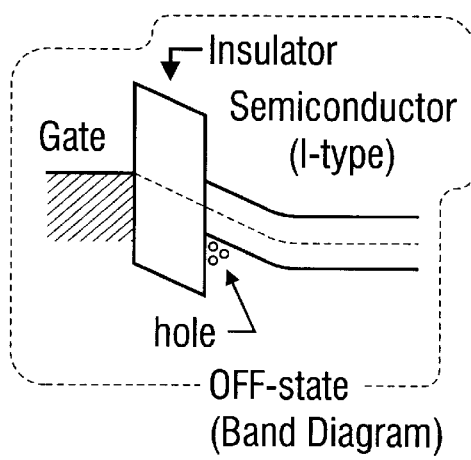
OFF-state
(Band Diagram)
↓
3C
FIG. 3B
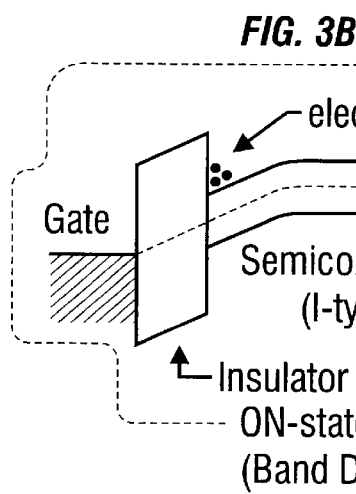
ON-state
(Band Diagram)
↓
3C
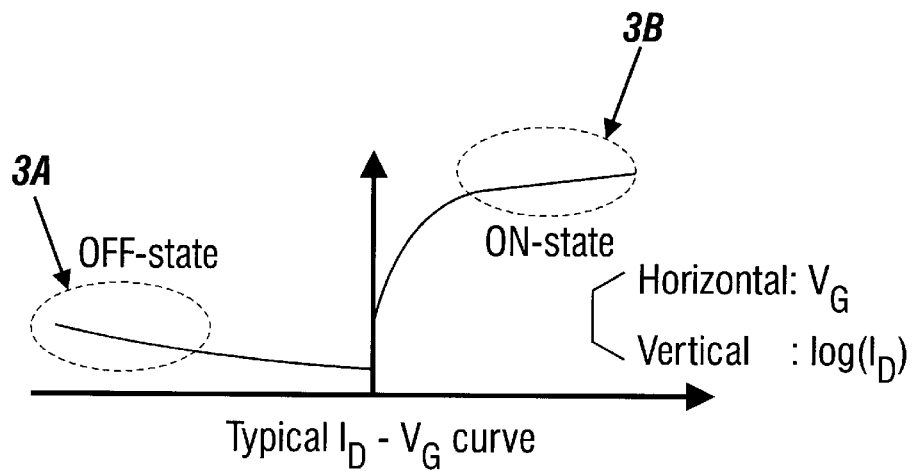
Typical $I_D$ - $V_G$ curve
Horizontal: $V_G$
Vertical: $\log(I_D)$
FIG. 3C

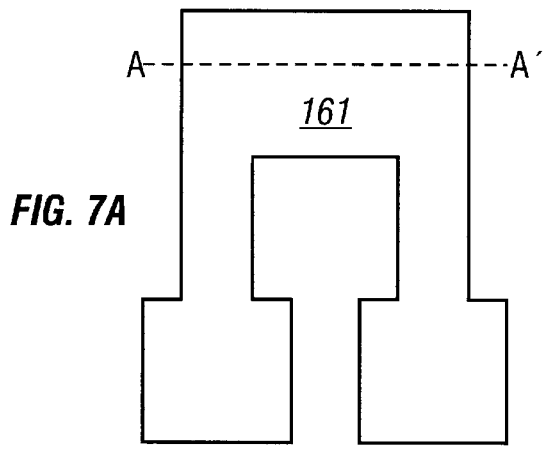
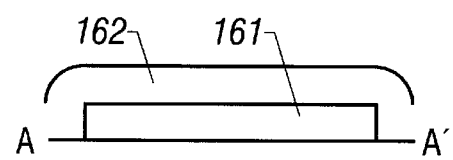
FIG. 7A
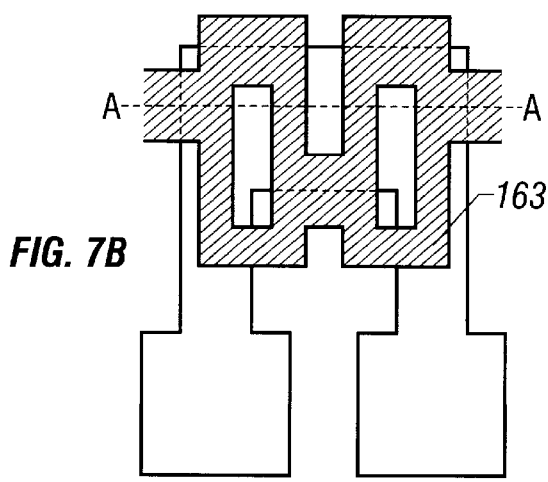
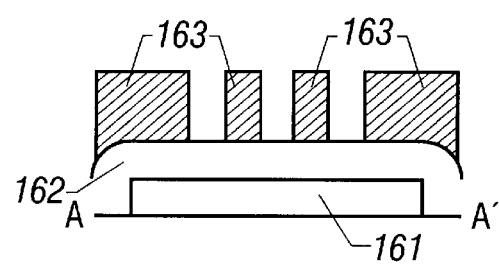
FIG. 7B
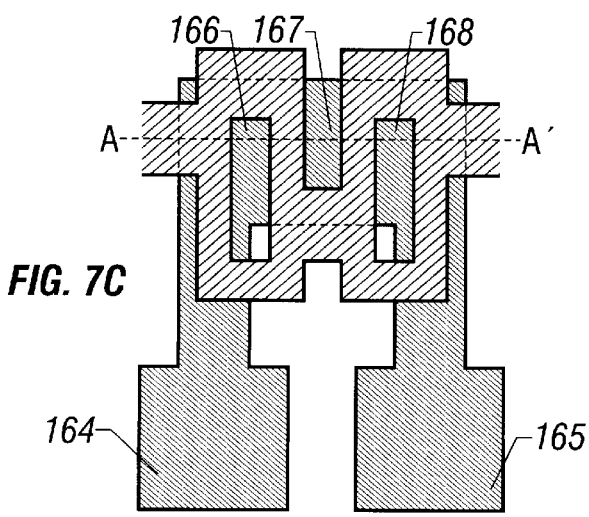
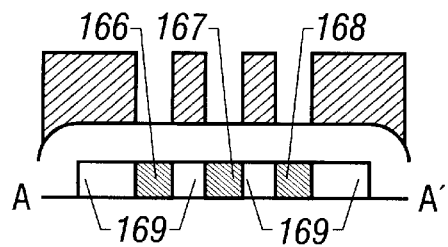
FIG. 7C

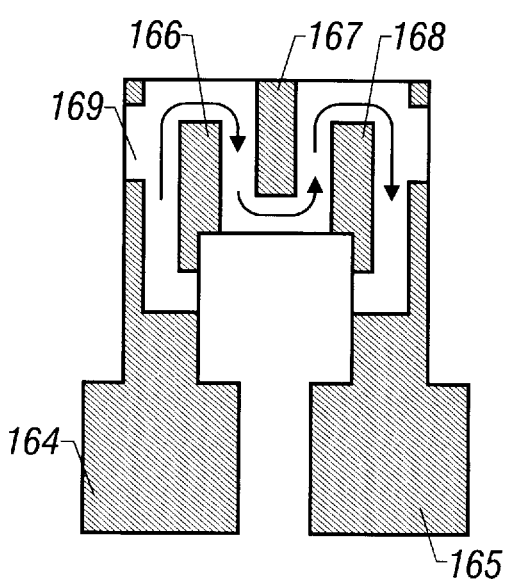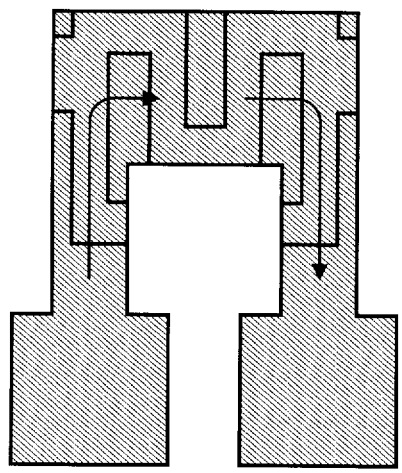
*FIG. 8A*  *FIG. 8B*

$V_G = -V$ $V_G = +V$ $V_G = +V$ $V_G = -V$

THIN FILM SEMICONDUCTOR DEVICE

BACKGROUND OF THE INVENTION

1. Field of the Invention

The present invention relates to a structure of a circuit element such as a thin film transistor (TFT) used in a thin film integrated circuit using a non-single crystal semiconductor formed on an insulating surface. The insulating surface according to the present invention signifies not only the surface of an insulator but also an insulating layer formed on the surface of a semiconductor or a metal. That is, the integrated circuit and the thin film transistor formed in accordance with the present invention include not only ones formed on an insulating substrate such as a glass substrate but also ones formed on an insulator formed on a semiconductor substrate such as a single crystal silicon substrate.

2. Description of the Related Art

A thin film semiconductor device such as a TFT is obtained by first forming a substantially intrinsic thin film semiconductor region (active layer) like an island-shape on an insulating surface, then forming an insulating film as a gate insulating film by a CVD method or a sputtering method, and forming a gate electrode thereon. Alternatively, a thin film semiconductor device may be formed by first forming a gate electrode, and then forming a gate insulating film and an active layer thereon. In the former method, source region/drain region are formed by diffusing (doping) n-type or p-type impurities into the intrinsic thin film semiconductor. In the latter method, although an impurity diffusion method is also sometimes used, a method of forming a separate n-type or p-type semiconductor film is general.

Conventional TFTs include an n-type or p-type source region/drain region, a substantially intrinsic conductive channel region, and a gate insulating film and a gate electrode on the channel region. Wirings/electrodes (referred to as a source wiring/electrode and a drain wiring/electrode, respectively) for electrical connection to the outside are connected to the source region and the drain region, and the TFT is controlled by three terminals of these wirings/electrodes and the gate electrode.

Since the distinction between the source region and the drain region is not clear especially for some circuits, the source region and the drain region in the following description are not distinguished from each other based on a circuit but are capable of arbitrarily being set. That is, an n-type or p-type region, which is not arbitrarily defined as a source region but to which a terminal is connected, is defined as a drain region. In recent years, because of necessity of increasing the electric mobility of a TFT, it has been examined to use crystalline semiconductor as a semiconductor of an active layer instead of amorphous semiconductor.

The most serious problem in a TFT using such a non-single crystal semiconductor, especially a crystalline non-single crystal semiconductor (for example, polycrystal silicon) is that a leak current (OFF-state current) is large. That is, when no voltage is applied to a gate electrode, or when a reverse voltage is applied thereto (non-selected state, OFF-state), since a channel (current path) is not formed, a current must not flow. However, actually, there was observed a current more than a leak current generally observed in a single crystal semiconductor. Accordingly, this phenomenon is considered to be intrinsic to the non-single crystal semiconductor.

Such a large leak current has caused a problem especially to the use in which a dynamic operation (holding of electric charge, etc.) is required. Also, in the use in which a static operation is required, the large leak current is not preferable since it increases consumed electric power.

In an active matrix circuit such as a liquid crystal display expected as general-purposes of TFTs, the TFTs operate as switching transistors for picture elements provided in matrix. At the operation, it is required that electric charges stored in the picture element electrodes or their auxiliary capacitors (holding capacitance) do not leak. If the leak current is large, the electric charges can not be held for a sufficient period of time.

Conventionally, in order to decrease the leak current, it has been regarded effective to lengthen a channel length or lessen a channel width. However, if such a method is adopted, although the absolute value of the leak current becomes small, a drain current (ON-state current) at the time when a voltage is applied to the gate electrode (selected state, ON state), also becomes small, so that a required operation sometimes can not be carried out. That is, this method can not improve the ratio of the drain current and the leak current (ON/OFF ratio).

SUMMARY OF THE INVENTION

In view of the above problems, the present invention has been made, and an object the present invention is to decrease a leak current and to improve an ON/OFF ratio in a TFT in which a non-single crystal semiconductor is used as an active layer.

The present invention relates to a thin film semiconductor device comprising a thin film semiconductor, a gate insulating film, and a gate electrode. According to the present invention, a base region and a floating island region, which are not included in a conventional TFT, are provided. Although the base region is close to a conventional channel region, it is not strictly identical thereto. Thus, it will be referred to as a different name in the following description of the present invention. Also, the definition of the base region is subtly different for various embodiments in the following description of the present invention. However, the basic conditions of the thin film semiconductor device of the present invention are that the thin film semiconductor is separately formed, and includes a source region and a drain region. Further, a gate electrode is provided upper or under the base region through a gate insulating film.

Further, the conductivity type of the base region is intrinsic or such a conductivity type as is opposite to that of the source region and the drain region. On the other hand, the conductivity type of the floating island region is the same as the source region and the drain region.

In the present invention, well-known various materials can be used as the thin film semiconductor. For example, silicon semiconductor such as single crystal silicon, polycrystal silicon, and amorphous silicon, a compound semiconductor such as gallium arsenide and gallium antimonide, and germanium semiconductor can be used. Impurities may be added into such semiconductor materials optionally.

Also, the material of the gate electrode is not especially limited. Thus, the gate electrode is made of a material selected from the group including various kinds of metals used for a normal transistor such as aluminum, tantalum, titanium, molybdenum and tungsten, silicon the resistance of which is decreased by doping, and alloys (silicide) of the metals and silicon. The gate electrode may be formed in such a structure (multilayer structure) that two or more layers of different materials are laminated.

In order to solve the above-stated problems, in addition to the above-mentioned basic conditions, the present invention satisfies the following conditions.

A thin film semiconductor device according to a first aspect of the present invention satisfies the following conditions (1) to (3).

(1) The thin film semiconductor is separately formed like an island by closed lines including a first outer edge and a second outer edge.

(2) The thin film semiconductor includes: a base region disposed between the source region and the drain region and being intrinsic or having a conductivity type opposite to that of the source/drain regions; a first floating island region having the same conductivity type as the source/drain regions and surrounded by the base region and the first outer edge; and a second floating island region having the same conductivity type as the source/drain regions and surrounded by the base region and the second outer edge.

(3) Each of the first and second outer edges is defined by a line or curve connecting the source region to the drain region.

A thin film semiconductor device according to a second aspect of the present invention satisfies the following conditions (4) and (5).

(4) The thin film semiconductor includes: a base region disposed between the source region and the drain region and being intrinsic or having a conductivity type opposite to that of the source/drain regions; and a floating island region having the same conductivity type as the source/drain regions and separated by the base region from the source region and the drain region.

(5) The shortest distance from the source region to the drain region via only the base region is larger than the shortest distance from the source region to the drain region via the base region and the floating island region.

A thin film semiconductor device according to a third aspect of the present invention satisfies the following condition (6).

(6) The thin film semiconductor includes: a base region continuous with the drain region from the source region and being intrinsic or having a conductivity type opposite to that of the source/drain regions; and a floating island region having the same conductivity type as the source/drain regions and separated by the base region from the source region and the drain region.

A thin film semiconductor device according to a fourth aspect of the present invention satisfies the following condition (7).

(7) The thin film semiconductor includes: only one base region being intrinsic or having a conductivity type opposite to that of the source/drain regions; and a floating island region having the same conductivity type as the source/drain regions and separated by the base region from the source region and the drain region.

A thin film semiconductor device according to a fifth aspect of the present invention satisfies the following conditions (8) and (9).

(8) The thin film semiconductor includes only the base region; the drain region; a base region continuous with the drain region from the source region and being intrinsic or having a conductivity type opposite to that of the source/drain regions; and a floating island region having the same conductivity type as the source/drain regions and separated by the base region from the source region and the drain region.

(9) A value obtained by dividing an area of the base region by the shortest distance from the source region to the drain region via only the base region is smaller than a value obtained by dividing an area of the thin film semiconductor except the source region and the drain region by the shortest distance from the source region to the drain region.

The following condition may be added to the third aspect of the present invention.

(10) An average width of a path on the base region from the source region to the drain region is smaller than an average width of a path on the thin film semiconductor from the source region to the drain region.

This condition is a restriction on a width where an electric current (leak current in this case) flows, similarly to the above-mentioned condition (9). However, in the third aspect of the present invention, since the thin film semiconductor may include a not-defined region other than the source region, drain region, base region, and floating island region, it is difficult to add the condition (9).

In any one of the devices according to the first to fifth aspects of the present invention, the following condition may be added.

(11) The thin film semiconductor includes a first main surface and a second main surface, and the floating island region includes a surface included in the first main surface and a surface included in the second main surface.

Since the thin film semiconductor is flat, it includes two main surface of an upper surface and a lower surface. The above-mentioned condition (11) restricts that the floating island region must be exposed on the first main surface (for example, upper surface) and the second main surface (for example, lower surface).

If the formation of the floating island region is carried out by diffusion (doping) of impurities, even if the diffusion of impurities is carried out from the upper surface, the impurities generally easily reach the lower surface, and in the manufacturing process, diffusion conditions are set on the assumption that such diffusion is conducted, so that the above-mentioned condition (11) is automatically satisfied. Accordingly, the above-mentioned condition (11) may be replaced by the following condition.

(12) The floating island region is formed by diffusion of impurities.

Further, in the present invention, since it is sufficient that if only the base region can be electrically controlled, the gate electrode is not required to be disposed upper or under the floating island region. Accordingly, the following condition may be added to the first to fifth aspects of the present invention.

(13) The shape of the base region is substantially equal to the shape of the gate electrode on the thin film semiconductor or below the thin film semiconductor.

In order to make the shape of the base region and the gate electrode equal to each other as described above, a self-alignment impurity diffusion technique using the gate electrode as a mask is used. In this case, not only the gate electrode itself but also a side wall formed on the side surface of the gate electrode by anisotropic etching is used as a mask for the impurity diffusion. Thus, the portion will be referred to as a gate electrode portion. Such a condition may be added to the first to fifth aspects of the present invention.

(14) The source region, the drain region, and the floating island region are formed by an impurity doping method in a self-alignment manner using the gate electrode portion as a mask.

Since the present invention may be combined with a well-known low concentration impurity region (LDD)

technique, the following condition may be added to the first to fifth aspects of the present invention.

(15) A region containing impurities of a first conductivity type with a concentration lower than the floating island region is intentionally provided at a border portion between the floating island region and the base region.

Further, in the thin film semiconductor devices according to the above-described the first to fifth aspects of the present invention, another gate electrode (overlap gate electrode) other than the gate electrode may be provided upper or under at least one floating island region.

The overlap gate electrode is formed in a layer different from the gate electrode, and normally formed in an upper layer than the gate electrode. Contrary to the gate electrode, a signal is not applied to the overlap gate electrode, and irrespective of the selected/non-selected state, it is always kept at a constant voltage.

All of the source region, the drain region and the base region are formed by an impurity diffusion method using the gate electrode as a mask. However, impurity diffusion may be carried out for these regions at the same time, or separately.

In the present invention, insulation between the gate electrode and the overlap gate electrode may become a problem. With respect to this problem, in addition to a method of depositing an insulator by a well-known vapor phase growth method, a method of forming an insulator film on the surface of the gate electrode by using a selective oxidation/compounding reaction such as an anodic oxidation method, is effective.

In the present invention, a material of the overlap gate electrode is not especially limited. Thus, the overlap gate electrode is made of a material selected from the group including various kinds of metals used for a normal transistor such as aluminum, tantalum, titanium, molybdenum, tungsten, silicon the resistance of which is decreased by doping, and alloys (silicide) of the metals and silicon. The overlap gate electrode may be formed in such a structure (multilayer structure) that two or more layers of different materials are laminated.

Further, in the thin film semiconductor devices according to the first to fifth aspects of the present invention, a blocking region may be provided in the base region.

In the above-mentioned structure, a portion of the base region which does not overlap the gate electrode, will be referred to as a block region. Generally, such a region is also referred to as an offset region. However, as described hereinafter, since an offset region exists in another portion, another name will be used to avoid confusion. The block region has the same conductivity type as the base region. The invention in which the block region is provided, is characterized in that a path from the source region to the drain region via only the base region, must pass through such a block region.

The above-mentioned condition is equivalent to the condition that the block region is provided so as to divide the base region in case that the base region is one (in case that there is only one path from the source region to the drain region).

The thin film semiconductor device according to the present invention is provided with the base region and the floating island region at the portions corresponding to a channel region of a conventional TFT. When considering the non-selected (OFF) state, it is hard to assume that the path of leak current from the source region to the drain region crosses the floating island region present therebetween. This is because a large potential barrier is formed between the base region and the floating island region. Thus, the leak current mainly flows along the base region.

However, since the floating island region exists in the base region, the width (average width) of the base region is narrower than that of a conventional channel region. Also, the path from the source region to the drain region may become longer. Accordingly, since the floating island region exists, the substantial channel length in the non-selected state can be made longer, and the channel width thereof can be made shorter. For this reason, the leak current is decreased.

Next, when considering the selected (ON) state, since a voltage is applied to the gate electrode, the base region is inverted, a potential barrier between the base region and the floating island region becomes small, and a (drain) current flows through not only the base region but also the floating island region. This is because the distance is short if the current crosses the floating island region. That is, in the selected state, the substantial channel length is shorter than that in the non-selected state, and the channel width becomes large. Thus, the drain current is increased.

In this way, it becomes possible to increase the ON/OFF ratio. In order to further lengthen the substantial channel length in the non-selected state, as is apparent from embodiments described hereinafter, the number of the floating island regions is made not less than 2, preferably not less than 5. Similarly, in order to narrow the substantial channel width, the interval between the floating island regions is preferably made as narrow as possible.

Incidentally, in order to add an explanation as to the above-mentioned condition (11), let us consider the semiconductor device having the structure as shown in FIG. 32 which does not satisfy the condition (11). As shown in FIG. 32, in the case where although floating island regions 2 and 3 have surfaces included in a first main surface 4 (exposed on the first main surface 4), they does not have surfaces included in a second main surface 5 (not exposed in the second main surface 4), as shown by arrows in the drawing, other than a leak current flowing in the base region 1 while avoiding the floating island regions 2 and 3, there is a leak current flowing under the floating island regions. Accordingly, the effect of suppressing the leak current is lost. Therefore, if the condition (11) is added to the first to fifth aspects of the present invention, the effect of the invention becomes remarkable.

BRIEF DESCRIPTION OF THE DRAWINGS

FIGS. 3(A) to 3(C) are views showing band diagrams and characteristics of drain current versus gate voltage of a base region of Embodiment 1;

FIGS. 7(A) to 7(C) are top views and sectional views showing manufacturing steps of a semiconductor device of Embodiment 4;

FIGS. 8(A) and 8(B) are explanatory views for explaining an operation principle of the semiconductor device of Embodiment 4;

DETAILED DESCRIPTION OF THE INVENTION

Preferred embodiments of the present invention will be described with reference to the accompanying drawings.

[Embodiment 1]

Figure 1:
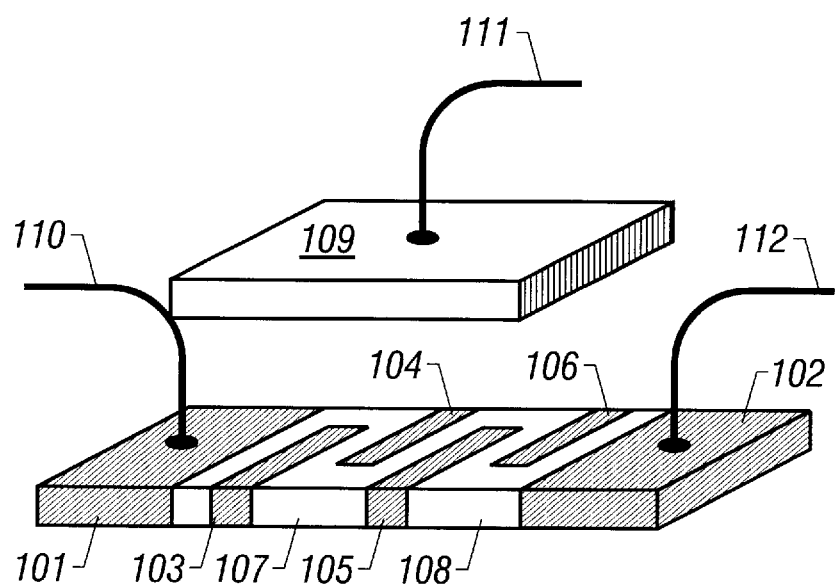
FIG. 1 is a conceptional view showing a semiconductor device of Embodiment 1.
Figure 2A:
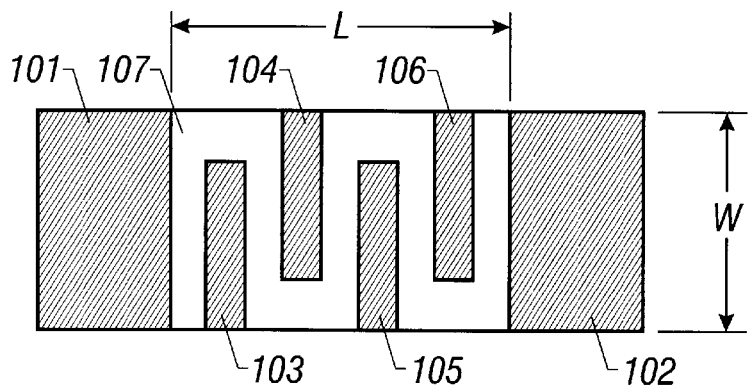
FIG. 2(A) is a top view showing the thin film semiconductor of Embodiment 1.

FIG. 1 shows Embodiment 1 of the present invention. FIG. 1 schematically shows a semiconductor device according to this embodiment. A source region 101, a drain region 102, floating island regions 103 to 106, and a base region 107 are formed in a common layer of a thin film semiconductor 108. FIG. 2(A) is a view showing the thin film semiconductor 108 seen from the above.

Here, in order to make the conductivity type of the source/drain regions 101 and 102, and the floating island regions 103–106 into an n-type, selectively doping of phosphorus with a dose of $1\times10^{12}$–$1\times10^{14}$ atoms/cm$^2$, preferably $3\times10^{12}$–$3\times10^{13}$ atoms/cm$^2$, for example, $1\times10^{13}$ atoms/cm$^2$ is carried out for the thin film semiconductor 108 formed of an intrinsic polycrystal silicon film with a thickness of 100 to 20,000 Å. On the other hand, doping is not carried out for the base region 107, so that the conductivity of the base region 107 is intrinsic.

A source wiring/electrode 110 is formed in the source region 101, and a drain wiring/electrode 134 is formed in the drain region 102. A gate electrode 109 is formed through a gate insulating film (not shown). The gate electrode 109 is directly electrically connected to a gate wiring 111.

Here, lines 113 and 114 connecting the source region 101 to the drain region 102 are defined as a first outer edge and a second outer edge, respectively.

The device having such a structure satisfies the first to fifth conditions of the present invention set forth in the Summary of the Invention section. For example, with respect to the first aspect of the present invention, since the thin film semiconductor 108 is separately formed like an island shape by closed lines including the first outer edge 113 and the second outer edge 114, the device satisfies the condition (1).

Also, since the thin film semiconductor 108 includes the intrinsic base region 107 existing between the source region 101 and the drain region 102, the first floating island regions 103–106 having the n-type like the source/drain regions 101 and 102 and surrounded by the base region 107 and the first outer edge 113, and the second floating island regions 103–106 having the same n-type and surrounded by the base region 107 and the second outer edge 114, the device satisfies the condition (2).

And as described above, both the first and second outer edges 113 and 114 are defined by the lines connecting the source region 101 with the drain region 102. Accordingly, the semiconductor device as shown in FIG. 1 is one according to the first aspect of the present invention.

Similarly, with respect to the second aspect of the present invention, since the thin film semiconductor 108 includes the intrinsic base region 107 existing between the n-type source region 101 and the drain region 102, and the floating island regions 103–106 having the n-type conductivity and divided by the base region 107 from the source region 101 and the drain region 102, the device satisfies the condition (4).

Further, since the shortest distance from the source region 101 to the drain region 102 via only the base region 107 is about 2.07 times as large as that from the source region 101 to the drain region via the base region 107 and the floating island regions 103 to 106 (that is, all portions except the source region 101 and the drain region 102 of the thin film semiconductor 108), the device satisfies the condition (5). Accordingly, the semiconductor device as shown in FIG. 1 is one according to the second aspect of the present invention.

Similarly, with respect to the third aspect of the present invention, since the thin film semiconductor 108 includes the intrinsic base region 107 continuous with the n-type drain region 102 from the n-type source region 101, and n-type floating island regions 103 to 106 separated from the source region 101 and the drain region 102 by the base region 107, the device satisfies the condition (6). Accordingly, the semiconductor device as shown in FIG. 1 is one according to the third aspect of the present invention.

Also, since an average width of a path leading on the base region 107 from the source region 101 to the drain region 102 is about one sixth as large as an average width (here, W) of a path leading on the thin film semiconductor 108 from the source region 101 to the drain region, the device satisfies also the condition (10).

Similarly, with respect to the fourth aspect of the present invention, since the thin film semiconductor 108 includes only one intrinsic basic region 107, and the floating island regions 103 to 106 having the same n-type conductivity as the source/drain regions 101 and 102 and separated from the source region 101 and the drain region 102 by the base region 107, the device satisfies the condition (7). Accordingly, the semiconductor device as shown in FIG. 1 is one according to the fourth aspect of the present invention.

Similarly, with respect to the fifth aspect of the present invention, since the thin film semiconductor 108 includes only the source region 101, the drain region 102, the intrinsic base region 107 continuous with the source region 101 from the drain region 102, and the floating island regions 103 to 106 having the same n-type conductivity as the source/drain regions 101 and 102 and separated from the source region 101 and the drain region 102 by the base region 107, the device satisfies the condition (8).

Further, since a value obtained by dividing the area of the base region 107 by the shortest length of a path from the source region 101 to the drain region 102 via only the base region 107 is about one third as large as a value obtained by dividing the area of the thin film semiconductor 108 other than the source region 101 and the drain region 102 by the shortest length of a path from the source region 101 to the drain region 102, the device satisfies the condition (9).

Figure 2B:
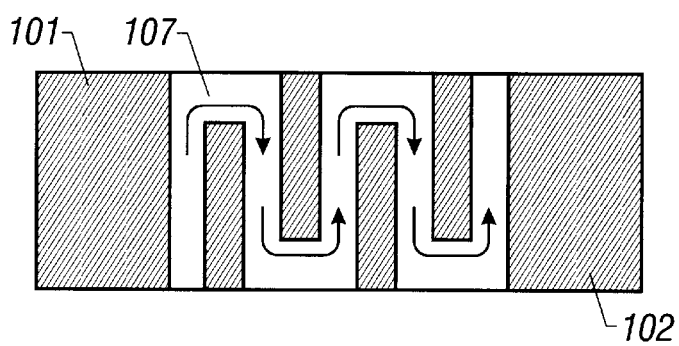
FIG. 2(B) is an explanatory view for explaining an operation principle of the semiconductor device of Embodiment 1.
Figure 2C:
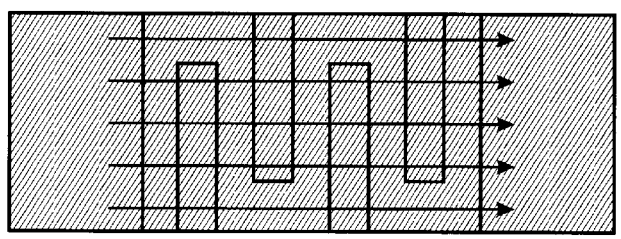
FIG. 2(C) is an explanatory view for explaining the operation principle of the semiconductor device of Embodiment 1.

FIGS. 2(B) and 2(C) show the flow of an electric current in this embodiment. FIG. 2(B) shows the non-selected (OFF) state, and the current flowing as shown by arrows is a leak current. On the other hand, FIG. 2(C) shows the selected (ON) state and the current shown by arrows is a drain current.

FIGS. 3(A) and 3(B) are band diagrams of the base region 107 in the vertical direction. FIG. 3(A) is the band diagram of the non-selected (OFF) state, and FIG. 3(B) is the band diagram in the selected (ON) state. FIG. 3(C) shows the characteristics of drain current $I_D$ versus gate voltage $V_G$. Here, the semiconductor device is assumed to be of an n-channel type.

In the non-selected (OFF) state, since a negative voltage is applied to the gate electrode 109, holes are induced in the vicinity of the surface of the semiconductor layer, which serve to make conduction (FIG. 3(A)).

As a result, in the non-selected state, as shown in FIG. 2(B) by the arrows, the leak current flows zigzag from the source region 101 to the drain region 102 in the base region 107 so as to avoid the floating island regions 103–106. In this case, although the apparent channel has a length of L and a width of W, the substantial channel based on the flow of the real leak current has a length longer than that of the apparent channel and has a width narrower than that of the apparent channel (FIG. 2(B)).

On the other hand, in the selected (ON) state, as shown in FIG. 3(B), the base region 107 is inverted by the voltage applied to the gate electrode 109, that is, the base region 107 becomes the same n-type as the floating island regions 103 to 106.

Since a positive voltage is applied to the gate electrode 109, electrons are induced in the vicinity of the surface of the semiconductor layer, which serve to make conduction.

As a result, the drain current with the carriers of electrons crosses the floating island regions 103 to 106 and flows in the base region 107. Accordingly, in the selected state, the size of the substantial channel is almost the same as that of the apparent channel (FIG. 2(C)).

Figure 2D:
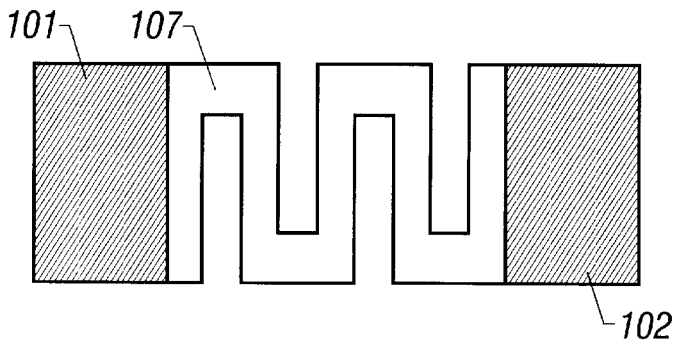
FIG. 2(D) is an explanatory view for explaining the operation principle of the semiconductor device of Embodiment 1.

For example, the same state as the non-selected state can be realized, using a rule of the same design, by forming the structure as shown in FIG. 2(D), which is obtained by removing the floating island regions 103 to 106 from the structure shown in FIG. 2(A). That is, a TFT in which the channel is arranged zigzag and the length of the channel becomes extremely long, is obtained.

However, in the TFT as shown in FIG. 2(D), it is impossible to flow a large drain current as in the semiconductor device according to this embodiment in the selected state. This is because in the conventional TFT, the substantial channel is equal to the geometrical channel even in any of the selected state and the non-selected state. On the other hand, as is apparent in the embodiment or also other embodiments, the present invention is characterized in that the substantial channel is greatly changed between the selected state and the non-selected state, so that the ON/OFF ratio can be made large.

If a device is designed by optimizing the rule of design without changing the values of L and W, the ON/OFF ratio of the semiconductor device having the same structure as this embodiment is 15 times as large as that of the TFT of FIG. 2(D).

Figure 4A:
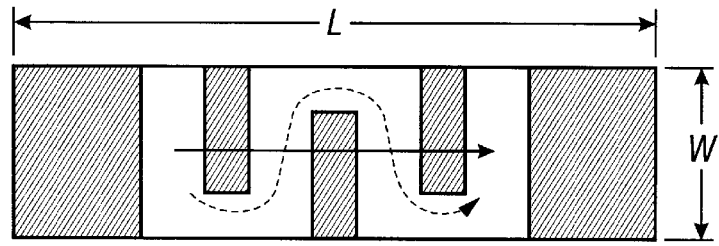
FIGS. 4(A) to 4(E) are views showing the semiconductor device, its cross-sections, and equivalent circuits of Embodiment 1.
Figure 4B:
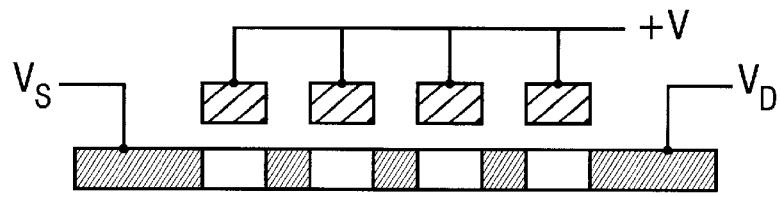
Figure 4C:
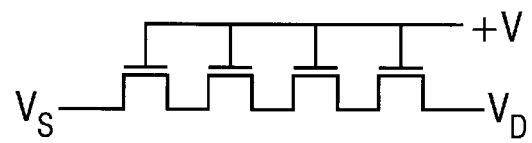

The above is equivalent to the words that equivalent circuits of the semiconductor device are different between the selected state and the non-selected state. In FIG. 4(A), the arrow of a solid line indicates the drain current in the selected state, and the arrow of a dotted line indicates the leak current in the non-selected state. In the n-channel type device, a positive voltage +V is applied to the gate electrode 109 in the selected state. At this time, the drain current with carriers of electrons flows while crossing the floating island regions 103 to 106, so that with respect to the drain current, the sectional view of the semiconductor device becomes one as shown in FIG. 4(B), and its equivalent circuit becomes a multigate type as shown in FIG. 4(C).

Figure 4D:
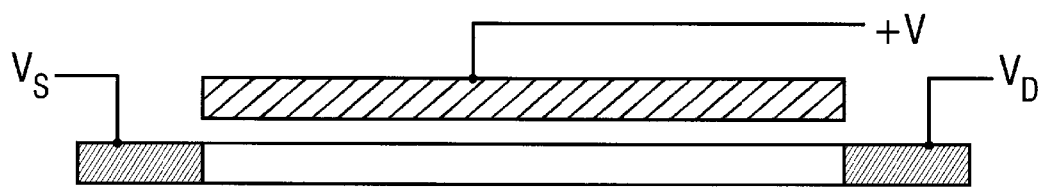
Figure 4E:
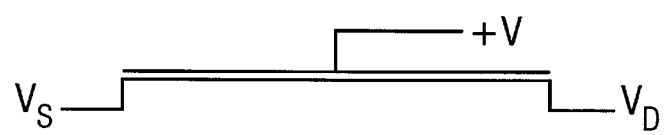

On the other hand, in the non-selected state, a negative voltage −V is applied to the gate electrode 109. At this time, the leak current with carriers of holes flows along the base region 107, so that with respect to the leak current, the sectional view of the semiconductor device becomes one as shown in FIG. 4(D) which is long. Also, its equivalent circuit becomes an insulated gate type device having a large channel width as shown in FIG. 4(E).

If a device is designed by optimizing the rule of design without changing the values of L and W, the ON/OFF ratio of the semiconductor device is 15 times as large as that of the TFT of FIG. 2(D).

The ON/OFF ratio is further improved if the ratio W/L is made higher. If such is adopted, the substantial channel length increases in the non-selected state, while the channel width increases in the selected state, so that the leak current decreases and the drain current increases. In this way, the substantial channel length in the non-selected state can be made 5 to 50 times as large as that in the non-selected state, and the substantial channel width in the non-selected state can be made half to one twentieth times as large as that in the selected state. As a result, the ON/OFF ratio can be magnified 100 times.

[Embodiment 2]

Figure 5A:
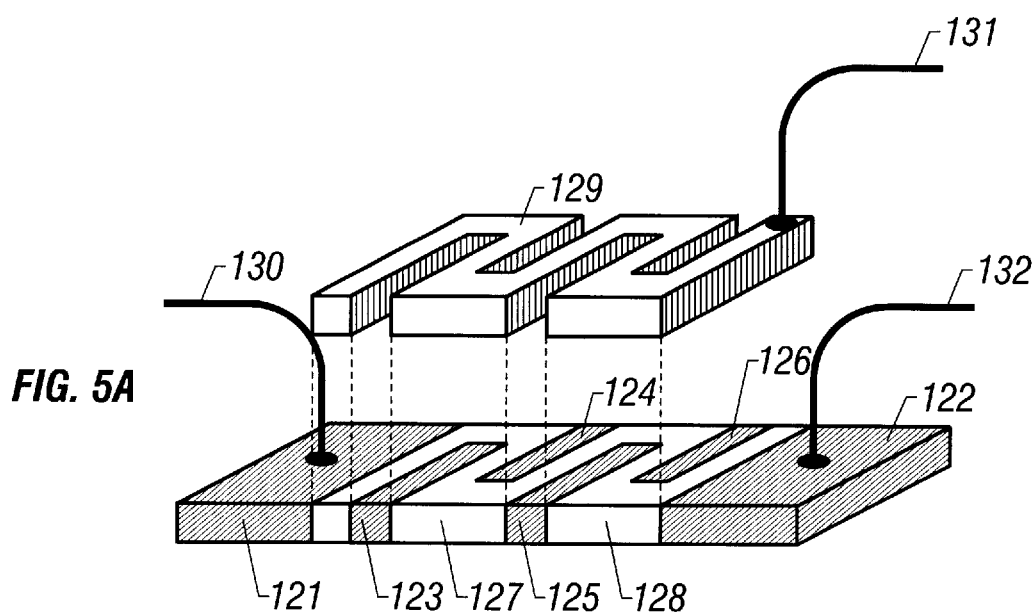
FIG. 5(A) is a conceptional view showing a semiconductor device of Embodiment 2.
Figure 5B:
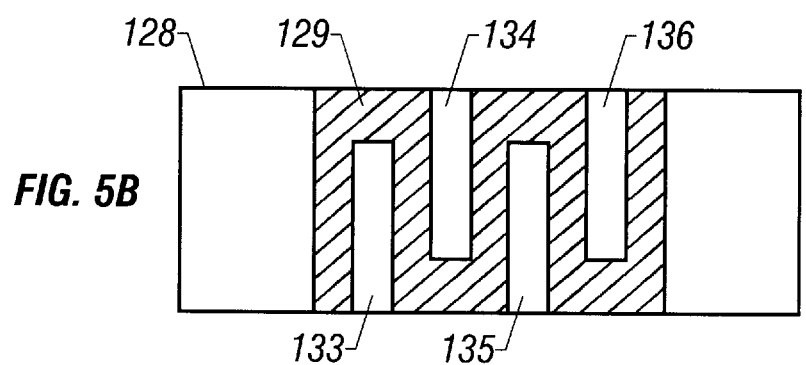
FIG. 5(B) is a top view showing a manufacturing step of the semiconductor device of Embodiment 2.
Figure 5C:
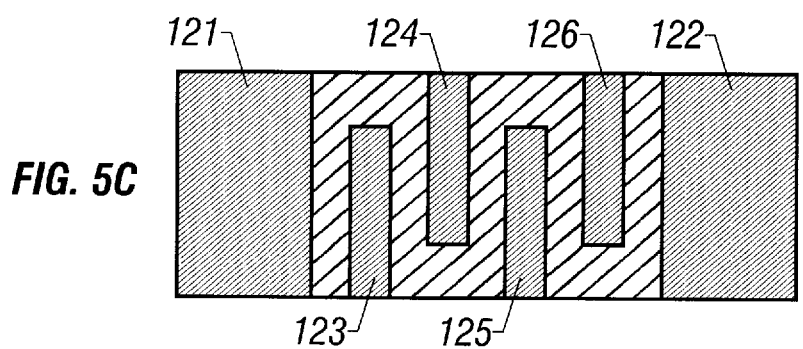
FIG. 5(C) is a top view showing a manufacturing step of the semiconductor device of Embodiment 2.

FIGS. 5(A) to 5(C) show this embodiment. FIG. 5(A) is a schematic view of a semiconductor device according to this embodiment. In the semiconductor device according to this embodiment, the gate electrode of the semiconductor device of Embodiment 1 is modified.

As shown in FIG. 5(A), a source region 121, a drain region 122, floating island regions 123 to 126, and a base region 127 are formed in the same layer of a thin film semiconductor 128. Here, in order to make the conductivity type of the source/drain regions 121 and 122 and the floating island regions 123 to 126 into a p-type, selective doping of boron with a concentration of $1 \times 10^{18}$–$1 \times 10^{22}$ atoms/cm$^3$, preferably $3 \times 10^{20}$–$3 \times 10^{21}$ atoms/cm$^3$, for example, $1 \times 10^{21}$ atoms/cm$^3$ is carried out for the thin film semiconductor 128 formed of an intrinsic polycrystal silicon film with a thickness of 100 to 20,000 Å. On the other hand, doping is not carried out for the base region 127, so that the conductivity of the base region 127 is intrinsic.

A source wiring/electrode 120 is formed in the source region 121, and a drain wiring/electrode 132 is formed in the drain region 122. A gate electrode 129 is formed through a gate insulating film (not shown). The gate electrode 129 is directly electrically connected to a gate wiring 131. This embodiment has such a structure as satisfies the condition (13) or (14) of the invention. That is, the shape of a portion of the gate electrode 129 existing on the thin film semiconductor 128 is substantially the same as the shape of the base region 127.

A method of forming such a structure will be described with reference to FIGS. 5(B) and 5(C).

First, on the thin film semiconductor 128 in which no doping is carried out, the gate electrode 129 having almost the same shape as the base region 127 is formed through the gate insulating film not shown (FIG. 5(B)).

Thereafter, doping of impurity is carried out using the gate electrode 129 as a mask, so that a p-type region is formed in the thin film semiconductor 128 region. In this way, the source region 121, the drain region 122, and the floating island regions 123 to 126 are formed. However, in the thin film semiconductor region 128, since doping is not carried intentionally out in a portion below the gate electrode 129, the portion remains intrinsic, which becomes the base region 127 (FIG. 5(C)).

Except the shape of the gate electrode 129, the semiconductor device according to this embodiment has the same structure as Embodiment 1 and has also the same operation.

[Embodiment 3]

Figure 6A:
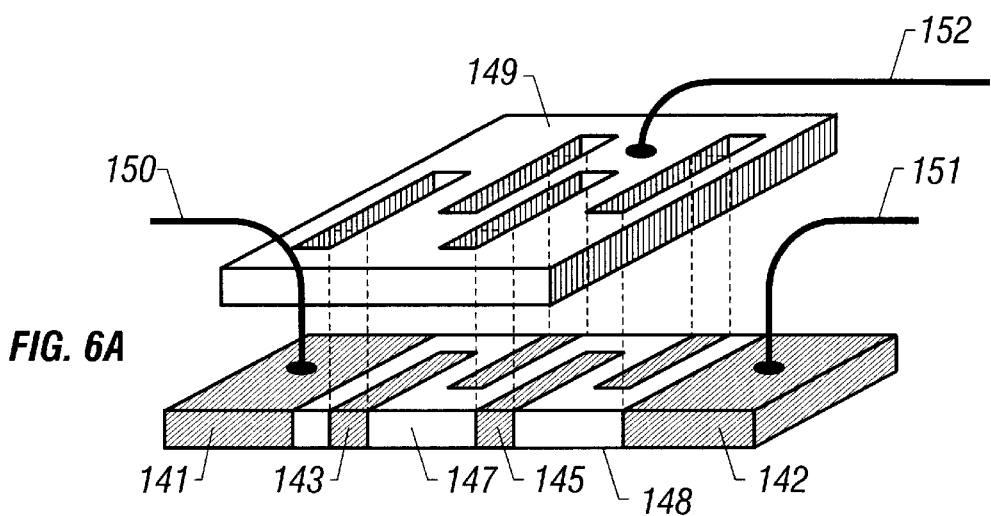
FIG. 6(A) is a conceptional view showing a semiconductor device of Embodiment 3.

FIG. 6(A) is a conceptional view showing a semiconductor device of Embodiment 3, in which the gate electrode of Embodiment 1 is modified. A source region 141, a drain region 142, floating island regions 143 to 146, and a base region 147 are formed in the same layer of a thin film semiconductor 148. Similarly to Embodiment 1 shown in FIG. 1, doping is not carried out for the base region 147 of the thin film semiconductor 148, so that the conductivity type of the base region 147 is the original conductivity type of the thin film semiconductor 148.

A source wiring/electrode 150 is formed in the source region 141, and a drain wiring/electrode 151 is formed in the drain region 142. A gate electrode 149 is formed through a gate insulating film (not shown). The gate electrode 149 is directly electrically connected to a gate wiring 152. The device according to this embodiment has such a structure as satisfies the above-mentioned condition (13) or (14). That is, the shape of a portion of the gate electrode 149 existing on the thin film semiconductor 148 is substantially the same as the shape of the base region 147 (FIG. 6(A)).

Figure 6B:
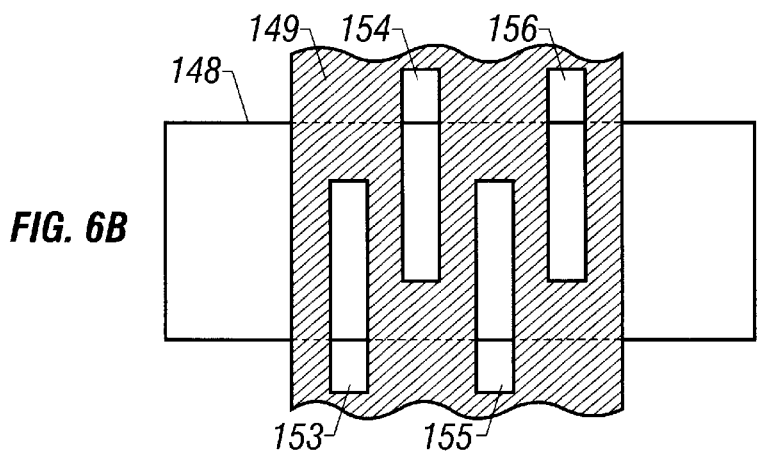
FIG. 6(B) is a top view showing a manufacturing step of the semiconductor device of Embodiment 3.
Figure 6C:
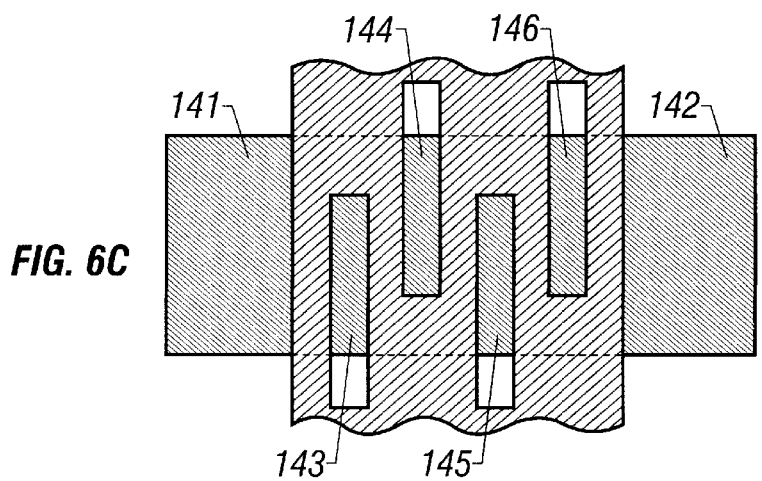
FIG. 6(C) is a top view showing a manufacturing step of the semiconductor device of Embodiment 3.

A method of obtaining such a structure will be described with reference to FIGS. 6(B) and 6(C).

First, the gate electrode 149 is formed on the thin film semiconductor 148 through the gate insulating film not shown. At this time, holes 153 to 156 are also formed at the portions corresponding to the floating island regions 143 to 146 to be formed (FIG. 6(B)).

Thereafter, doping of impurities is carried out to form regions of required conductivity types in the thin film semiconductor region 148. In this way, the source region 141, the drain region 142, and the floating island regions 143 to 146 are formed. However, even in the thin film semiconductor region 148, doping is not carried out in a portion under the gate electrode 149, so that the portion remains the original conductivity type of the thin film semiconductor, which becomes the base region 147 (FIG. 6(C)).

Except the shape of the gate electrode 149, the semiconductor device of FIG. 6 has the same structure as the semiconductor device of FIG. 1, and also has the same operation.

[Embodiment 4]

FIGS. 7(A) to 7(C) show Embodiment 4. FIGS. 7(A) to 7(C) schematically show manufacturing steps of a semiconductor device in this embodiment. The left-side drawings are schematic views (top views) seen from the above, and the right-side thereof are sectional views taken along A—A' of the top views.

First, a thin film semiconductor 161 is formed of intrinsic polycrystal silicon, and a gate insulating film is formed of silicon oxide or silicon nitride with a thickness of 1,000 to 20,000 Å to cover the thin film semiconductor (FIG. 7(A)).

Further, a gate electrode 163 is formed of a material such as aluminum, tantalum, titanium, molybdenum, tungsten, or silicon (FIG. 7(B)).

Using the gate electrode 163 as a mask, phosphorus or boron is introduced into the thin film semiconductor 161 by an ion implantation method or the like in a self-alignment manner. In this way, a source region 164, a drain region 165, and floating island regions 166–168 are formed. Since the impurities are not introduced into a portion of the thin film semiconductor under the gate electrode, the portion remains intrinsic, which becomes a base region 169 (FIG. 7(C)).

The flow of an electric current in the thin film semiconductor 161 according to this embodiment is as shown in FIGS. 8(A) and 8(B). FIG. 8(A) shows the non-selected (OFF) state, and the flowing current is the leak current. As shown by arrows in the drawing, in the non-selected state, the leak current flows zigzag in the base region 169 from the source region 164 to the drain region 165 while avoiding the floating island regions 166 to 168. In this case, the length of the substantial channel is longer than that of the apparent channel, and the width of the substantial channel is narrower than that of the apparent channel (FIG. 8(A)).

On the other hand, in the selected (ON) state, the base region 169 is inverted by a voltage applied to the gate electrode 163, that is, the base region 169 becomes the same conductivity type as the floating island regions 166 to 168. Thus, the drain current flows while crossing the floating island regions 166 to 168. Accordingly, in the selected state, the size of the substantial channel is almost the same as that of the apparent channel (FIG. 8(B)).

[Embodiment 5]

Figure 9A:
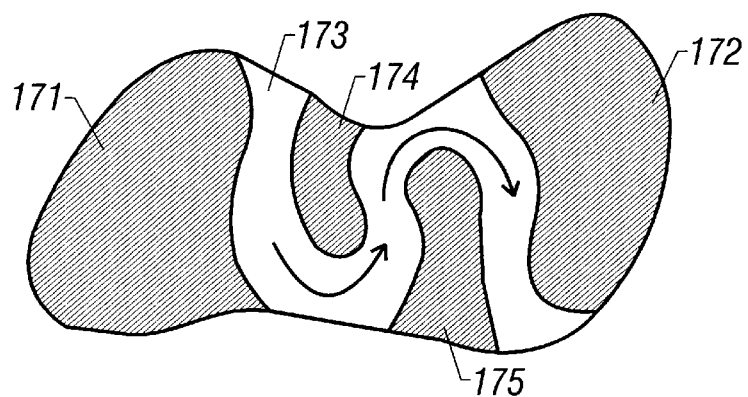
FIGS. 9(A) to 9(D) are conceptional views showing a semiconductor device of Embodiment 5.
Figure 9B:
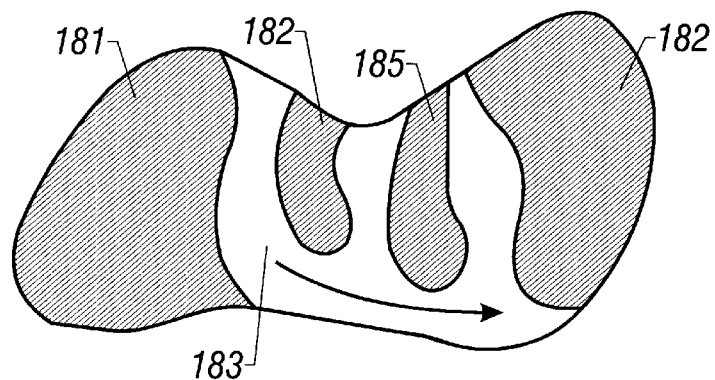
Figure 9C:
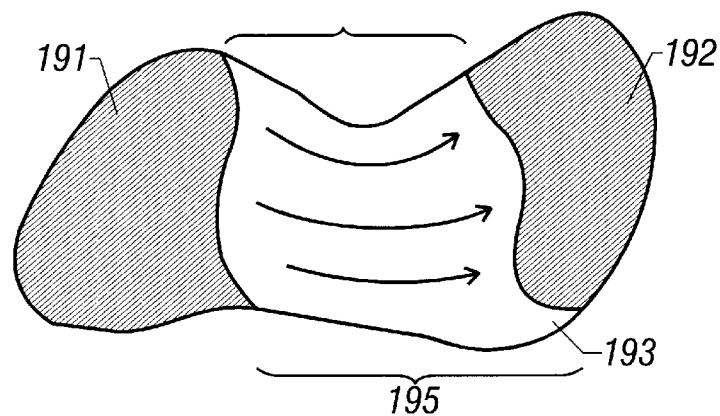

FIGS. 9(A) to 9(D) show some examples of this embodiment of the present invention. FIG. 9(C) is a conceptional view of a conventional TFT. That is, in an island-like thin film semiconductor, an intrinsic channel region 193 where intentional doping of n-type or p-type impurities is not carried out, is formed between a source region 191 and a drain region 192, and the channel region 193 is controlled by a gate electrode, so that a current flows between the source region 191 and the drain region 192 as shown by arrows. Also in the non-selected state, as shown by the arrows, a leak current flows from the source region 191 to the drain region 192. Here, a first outer edge 194 and a second outer edge 195 are curves connecting the source region 191 to the drain region 192. The island-like thin film semiconductor is separately formed by closed lines including the outer edges 194 and 195. In such a TFT, since floating island regions do not exist, it is not included in the present invention (FIG. 9(C)).

On the other hand, a semiconductor device in which floating island regions are formed in a channel region, is included in the present invention. In FIG. 9(A), in addition to a source region 171 and a drain region 172, floating island regions 174 and 175 are provided, and a portion therebetween is made a base region 173. Since the thin film semiconductor device having such a structure is substantially the same as that of FIG. 1, similarly to Embodiment 1, the device satisfies the first to fifth conditions of the present invention.

FIG. 9(B) also shows an example of the invention. However, although two floating island regions 184 and 185 exist, since both of the floating island regions 184 and 185 are surrounded by an outer edge and a base region 183, a semiconductor device of this example does not satisfy the condition (2) required in the first aspect of the present invention. Accordingly, the device is not one according to the first aspect of the present invention.

Also, the shortest distance from a source region 181 to a drain region 182 via only the base region 183 is not larger than the shortest distance from the source region 181 to the drain region 182 via the base region 183 and the floating island regions 184 and 185. Thus, since the semiconductor device does not satisfy the condition (5) required in the second aspect of the present invention, it is not also one according to the second aspect of the invention.

However, since a thin film semiconductor includes the intrinsic base region 183 continuous with the source region 181 from the drain region 182, and the floating island regions 184 and 185 having the same conductivity type as the source/drain regions 181 and 182 and separated from the source region 181 and the drain region 182 by the base region 183, the semiconductor device satisfies the condition (6).

Accordingly, the device is one according to the third aspect of the present invention.

In addition, since an average width of a path on the base region 183 from the source region 181 to the drain region 182 is about one third times as large as that of a path on the thin film semiconductor from the source region 181 to the drain region 182, the device also satisfies the condition (10).

Further, since the thin film semiconductor includes only one intrinsic base region 183 and the floating island regions 184 and 185, the device satisfies the condition (7). Accordingly, the device is one according to the fourth aspect of the present invention.

Also, since the thin film semiconductor includes only the source region 181, the drain region 182, the intrinsic base region 183 continuous with the source region 181 from the drain region 182, and the floating island regions 184 and 185, the device satisfies the condition (8). Further, since a value obtaining by dividing an area of the base region 183 by a shortest path length from the source region 181 to the drain region 182 via only the base region 183 (in FIG. 9(B), this value of the shortest path length is almost the same as a shortest path length from the source region 181 to the drain region 182) is smaller than a value obtained by dividing an area of the thin film semiconductor except the source region 181 and the drain region 182 (that is, the sum of areas of the base region 183 and the floating island regions 184 and 185), the semiconductor device satisfies the condition (9). Accordingly, the device is one according to the fifth aspect of the present invention.

The substantial channel length in the non-selected state is the distance in which the leak current shown by arrows in the drawing flows. As is apparent from the drawing, in the semiconductor device having the structure as shown in FIG. 9(B), the substantial channel length in the non-selected state is not large in comparison with that shown in FIG. 9(A), and also is not large in comparison with the substantial channel length in the selected state. Since the first and second aspects of the present invention require that the substantial channel length in the non-selected state is larger than the substantial channel length in the selected state, it is needless to say that the semiconductor device is not one according to the first or second aspect of the present invention.

However, the semiconductor device as shown in FIG. 9(B) does not have the leak current equal to that of the conventional TFT as shown in FIG. 9(C). The primary reason is that since the floating island regions 184 and 185 are formed, as compared with the substantial channel width in the selected state, the substantial channel width in the non-selected state is decreased. Accordingly, the leak current can be suppressed. Since the third to fifth aspects of the present invention require that the substantial channel width in the non-selected state is smaller than the substantial channel width in the selected state, the semiconductor device is one according to the third to fifth aspects of the present invention.

Figure 9D:
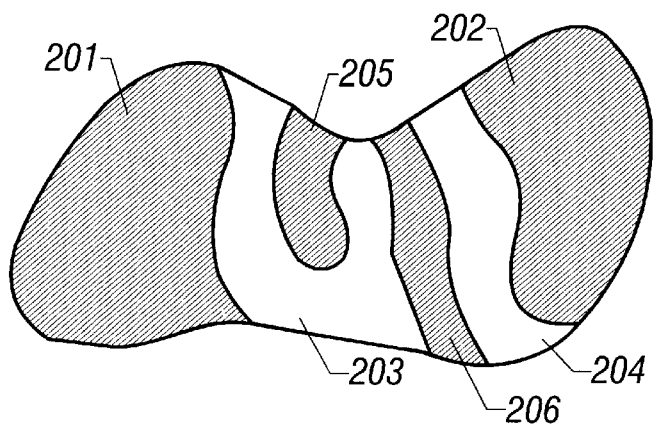

Next, regarding a semiconductor device as shown in FIG. 9(D), other than a source region 201, a drain region 202, and a floating island region 205, a region 206 having the same conductivity type as those is provided, and any electrode/wiring is not connected to the region 206. Further, intrinsic regions 203 and 204 are formed.

In the device having such a structure, since the region 206 is surrounded by not only a first outer edge and the regions 203 and 204 corresponding to a base region but also a second outer edge, the device does not satisfy the above-described condition (2). Therefore, the device is not one according to the first aspect of the present invention.

Further, since the intrinsic regions 203 and 204 corresponding to the base region are separated, it is impossible to lead from the source region to the drain region via only the base region (passing through the region 206 without fail). Thus, there is no conception of a shortest distance from the source region to the drain region via only the base region, that is, the device does not satisfy the condition (5). Accordingly, the device is not one according to the second aspect of the present invention.

Further, since any of the intrinsic regions 203 and 204 corresponding to the base region are divided by the region 206, the base region is not continuous with the drain region from the source region, so that the device does not satisfy the above-described conditions (6) and (8). Accordingly, the device is not one according to the third and fifth aspects of the present invention.

Since there are two intrinsic regions corresponding to the base region, the device does not satisfy the condition (7) and is not also one according to the fourth aspect of the present invention. Accordingly, the semiconductor device having such a structure as shown in FIG. 9(D) is not anyone of the present invention. However, if an electrode/wiring is connected to the region 206, the region becomes a source region or a drain region, and the device substantially becomes identical to FIG. 9(B) in structure except that the floating island region is one. Accordingly, the device is one according to the third to fifth aspects of the present invention (FIG. 9(D)).

[Embodiment 6]

Figures 10A, 10B:
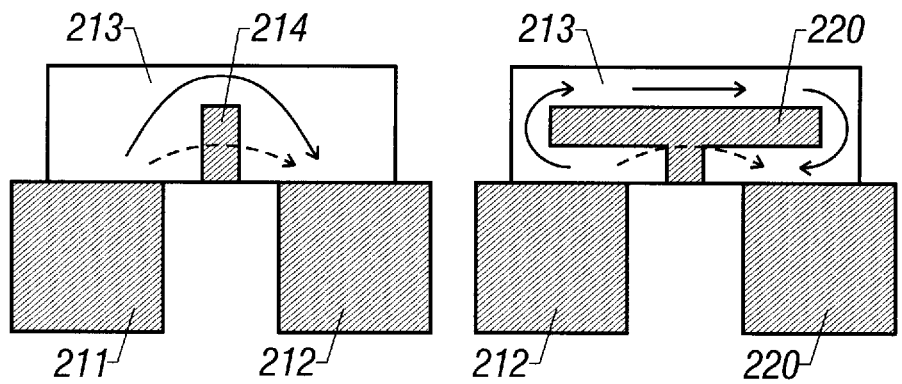
FIGS. 10(A) and 10(B) are conceptional views showing a semiconductor device of Embodiment 6.

FIGS. 10(A) and 10(B) show some examples according to this embodiment. A semiconductor device having such a structure as shown in FIG. 10(A) includes a floating island region 214 between a source region 211 and a drain region 212 (any regions are of n-type) and an intrinsic base region 213. In such a device, since the floating island region is only one, the device does not satisfies the condition (2) of the present invention. Thus, the device is not one according to the first aspect of the present invention. However, in the selected state, the drain current flows in the base region 213 from the source region 211 to the drain region 234 while crossing the floating island region 214 as shown by an arrow of a dotted line in the drawing. On the other hand, since the floating island region 214 exists, the leak current in the non-selected state flows through only the base region as shown by an arrow of a solid line in the drawing. That is, since the substantial channel length in the non-selected state (arrow of a solid line) is longer than the substantial channel length in the selected state (arrow of a dotted line), the device satisfies the condition (5). Therefore, the device is one according to the second aspect of the present invention.

This effect is further improved by making a floating island region 220 T-shaped as shown in FIG. 10(B). Thus, it has been made clear from the above examples that if the floating island region 220 is provided in the path of the drain current in the selected state, the path length of the leak current becomes long since it must flow while avoiding the floating island region 220, so that the leak current is further decreased.

Although FIG. 10(B) shows that the floating island region has a sufficiently large area, even if the area is very small, if the arrangement thereof is suitable, it is very effective in decreasing the leak current.

[Embodiment 7]

Figure 11:
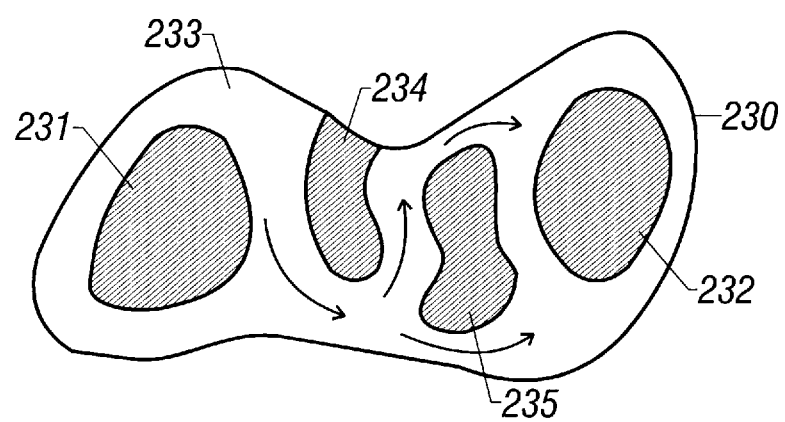
FIG. 11 is a conceptional view showing a thin film semiconductor of a semiconductor device of Embodiment 7.

FIG. 11 shows Embodiment 7. FIG. 11 shows only a thin film semiconductor 230 of a semiconductor device according to this embodiment. The thin film semiconductor 230 includes a p-type source region 231, a p-type drain region 232, p-type floating island regions 234 and 235, and a lightly doped n-type base region 233. The device satisfies the conditions (4) and (8). The leak current in the non-selected state flows as shown by arrows. Since such a semiconductor device does not include an outer edge satisfying the condition (3), the device shown in FIG. 11 is not one according to the first of the present invention.

However, since the shortest distance from the source region 231 to the drain region 232 via only the base region 233 is larger than the shortest distance from the source region 231 to the drain region 232 via the base region 233 and the floating island regions 234 and 235, the device satisfies the condition (5) and is one according to the second aspect of the present invention.

Similarly, since the base region 233 is only one leading from the source region 231 to the drain region 232, the device satisfies the conditions (6) and (7), and is one according to the third and fourth aspects of the present invention.

Further, when a value obtained by dividing an area s of the base region 233 by the shortest path length l from the source region to the drain region via only the base region is compared with a value obtained by dividing an area S of the thin film semiconductor 230 except the source region 231 and the drain region 232 by the shortest path length L from the source region 231 to the drain region 232, the relation of s/l<S/l<S/L is concluded because of the relation of s<S and l>L. That is, the former value is smaller than the latter value. Accordingly, the device satisfies the condition (9) and is one according to the fifth aspect of the present invention.

In this way, even if the circumference of the source region 231 and the drain region 232 are surrounded by the base region 233, the effect of decreasing the leak current of the invention is not lost.

[Embodiment 8]

FIGS. 12(A) to 12(D) and FIGS. 13(A) and 13(B) show this embodiment in which the invention is applied to an active matrix type display device. The active matrix type display device according to this embodiment is, for example, a circuit of a thin film semiconductor device used for a liquid crystal display device or the like.

Figure 12A:
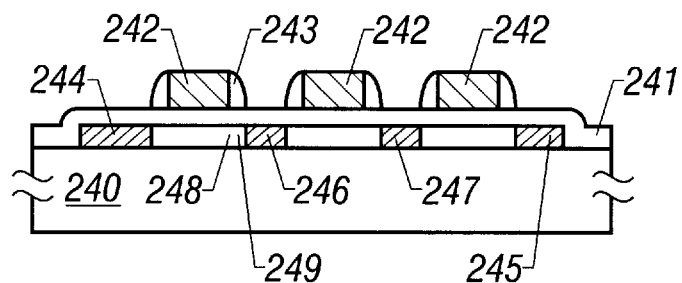
FIGS. 12(A) to 12(D) are sectional views showing a semiconductor device of Embodiment 8.
Figure 12B:
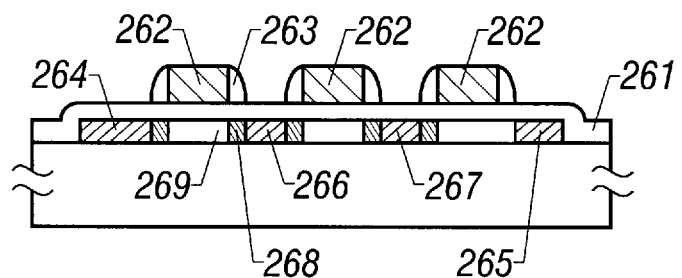
Figure 12C:
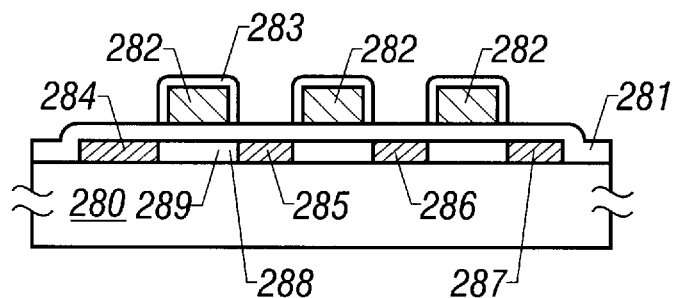
Figure 12D:
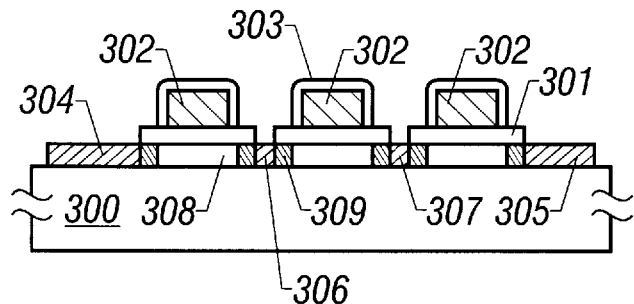
Figure 13A:
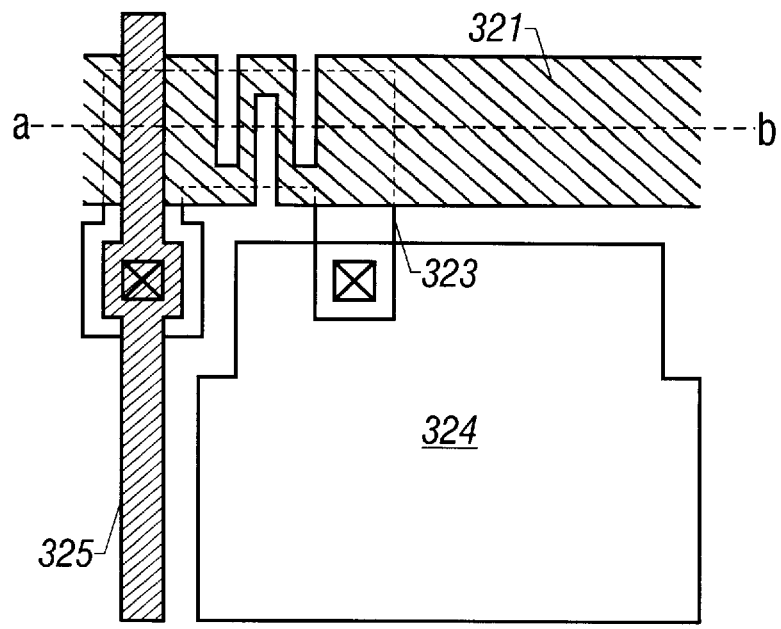
FIGS. 13(A) and 13(B) are top views schematically showing an active matrix circuit of Embodiment 8.

FIG. 13(A) is a top view showing a unit picture element of the circuit according to this embodiment. That is, a gate wiring (selecting line) 321 and a data line 325 are arranged in matrix so as to intersect with each other, and a thin film semiconductor 323 and a picture element electrode 324 are disposed therebetween. In this embodiment, a part of the gate line is etched, so that the shape equivalent to FIG. 5(A) is obtained. FIGS. 12(A) to 12(D) show the section taken along the line a-b of FIG. 13(A).

First, FIG. 12(A) will be described. In this example, by using a side wall forming technique, an offset portion is formed.

An intrinsic thin film semiconductor is formed like an island on an insulating substrate 240, and a gate insulating film 241 is formed. A gate electrode 242 having the shape equivalent to FIG. 5(A) is formed, and by a well-known side wall forming technique, a side wall 243 of an insulator is formed on a side surface of the gate electrode 242. Using the gate electrode 242 and the side wall 243 (the combination will be referred to as a gate electrode portion) as a mask, through the gate insulating film 241, n-type impurity ions are accelerated and implanted into the intrinsic thin film semiconductor 242 on the insulating substrate 240, so that a source region 244, a drain region 245, and floating island regions 246 and 247 are formed as n-type impurity regions. At this time, since the n-type impurity is not implanted into a portion under the gate electrode 242, the portion becomes a base region 248. Also, since the n-type impurity is not implanted into a portion under the side wall 243 or the amount of implantation is remarkably small, an offset region 249 is formed. By providing such an offset region 249, the leak current can be decreased, and when combined with the present invention, the leak current can be further decreased.

FIG. 12(B) shows a semiconductor to which a well-known side wall forming technique and a low concentration impurity region forming technique are applied.

An intrinsic thin film semiconductor is formed like an island on an insulating substrate 260, and an gate insulating film 261 is formed. A gate electrode 262 having the shape equivalent to FIG. 5(A) is formed. Then, using the gate electrode 262 as a mask, low concentration n-type impurities (the concentration is preferably 1/100 to 1/10,000 times as large as that in the source/drain region) are implanted into the thin film semiconductor (first doping). Thereafter, by a well-known side wall forming technique, a side wall 263 is formed on a side surface of the gate electrode 262. The side wall 263 may be conductive or insulated.

Using the gate electrode 262 and the side wall 264 (the combination will be referred to as a gate electrode portion) as a mask, through the gate insulating film 261, n-type impurity ions are accelerated and implanted into the intrinsic thin film semiconductor on the insulating substrate 260 to obtain n-type high concentration impurity regions 265 to 268 (second doping). Among the high concentration impurity regions 264 to 267, a region 264 is a source region, a region 265 is a drain region, and regions 266 and 267 are floating island regions.

At the second doping, since the n-type impurity is not implanted into a portion under the side wall 263, and the portion is of low concentration by the implantation of the first doping, a low concentration n-type region 268 is formed. Also, since the impurity is not implanted into a portion under the gate electrode 262 even by the first doping and second doping, the portion remains intrinsic and becomes a base region 269. By providing the low concentration n-type region 268, the deterioration due to shortening of the channel of the device can be prevented.

Other than the above, the offset structure can be obtained using an anodic oxidation technique as disclosed in Japanese Patent Unexamined Publication No. Hei. 6-291315.

As shown in FIG. 12(C), an anodic oxidation film 284 is formed on a side surface and a top surface of a gate electrode 283 having the shape equivalent to FIG. 5(A). Even when the gate electrode is used as a mask, an offset region 288 similar to FIG. 12(A) can be formed in a thin film semiconductor on an insulating substrate 280 between a base region 289 and n-type regions 284 to 287. Incidentally, in the n-type regions 284 to 287, a region 284 is a source region, a region 285 is a drain region, and regions 286 and 287 are floating island regions.

Further, as disclosed in Japanese Patent Unexamined Publication No. Hei. 7-169974, using an anodic oxidation technique of a side surface, a low density impurity region may be formed. FIG. 12(D) shows a thin film semiconductor device in which a low concentration impurity region is formed by using the anodic oxidation technique of the side surface.

An insulating film on the thin film semiconductor is selectively etched to form a gate insulating film 301 having the shape equivalent to FIG. 5(A).

Then, the anodic oxidation of the gate electrode 302 is carried out in two steps, and using the thus obtained anodic oxidation film as a mask, the insulating film on the thin film semiconductor is selectively etched to form the gate insulating film 301. Thereafter, although a part of an anodic oxidation film 303 is made remain, other anodic oxidation film is removed. By using the gate electrode 302, anodic oxidation covering film 303, and the gate insulating film as masks, doping is carried out to form an n-type source region 304, a drain region 305, floating island regions 306 and 307, and low concentration n-type regions 308 between the base region 307 and the circumferences of these regions in the intrinsic thin film semiconductor on an insulating substrate 300.

Figure 13B:
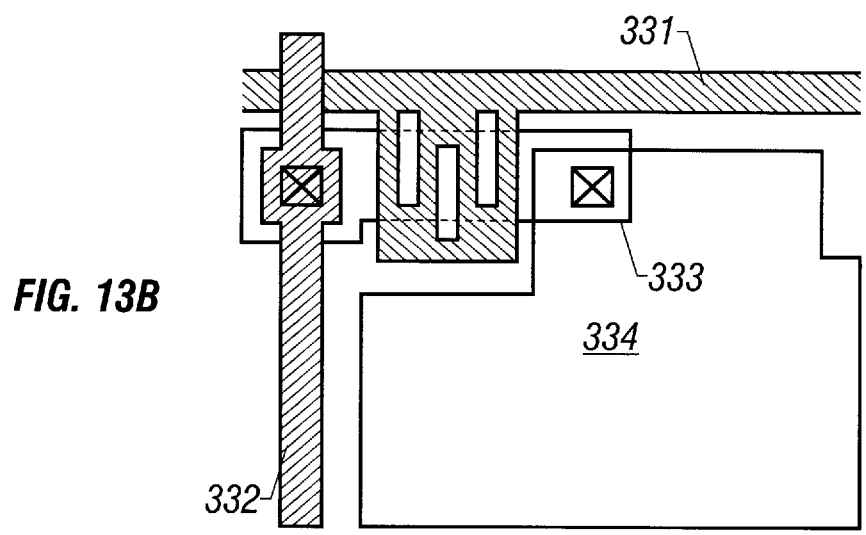

Incidentally, the circuit arrangement as shown in FIG. 13(A) may be replaced by that as shown in FIG. 13(B). Here, a gate wiring (selecting line) 331 and a data line 332 are arranged in matrix so as to intersect with each other, and a thin film semiconductor 333 and a picture element electrode 334 are provided therebetween.

[Embodiment 9]

Figure 14:
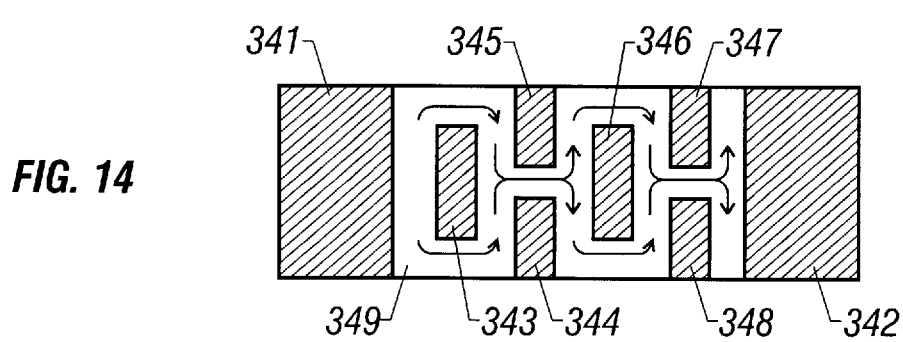
FIG. 14 is a conceptional view of a semiconductor device of Embodiment 9.

FIG. 14 shows Embodiment 9. A semiconductor device having the structure as shown in FIG. 14 includes an n-type source region 341, an n-type drain region 342, n-type floating island regions 343 to 348 and an intrinsic base region 349. The leak current in the non-selected state flows as shown by arrows. On the other hand, in the selected state, the drain current flows all surfaces of the base region 349 and the floating island regions 343 to 348. Although there are some paths of the leak current in the non-selected state, as compared with the flow of the drain current in the selected state, the length of any paths is long and the width thereof is narrow. Thus, the leak current is decreased.

[Embodiment 10]

Figure 15A:
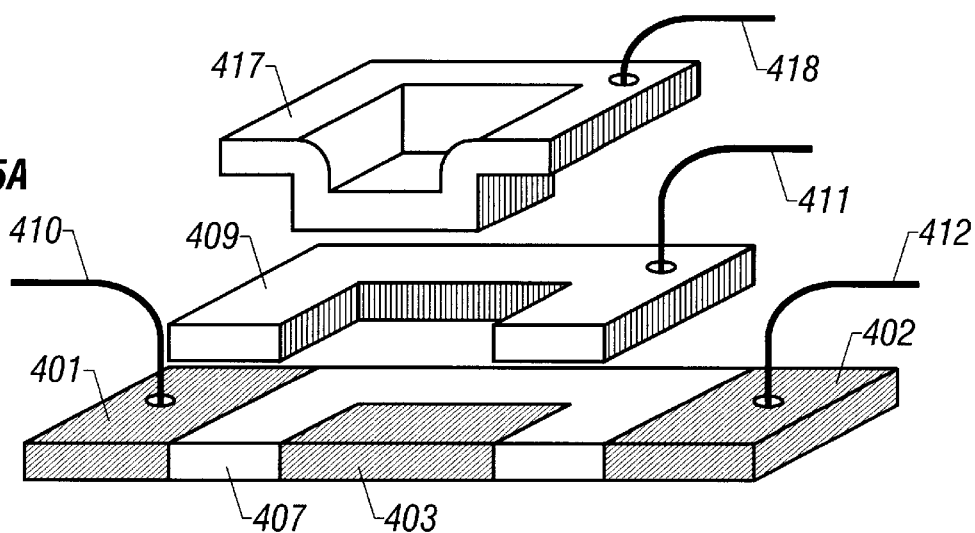
FIG. 15(A) is a view schematically showing a semiconductor device of Embodiment 10.
Figure 15B:
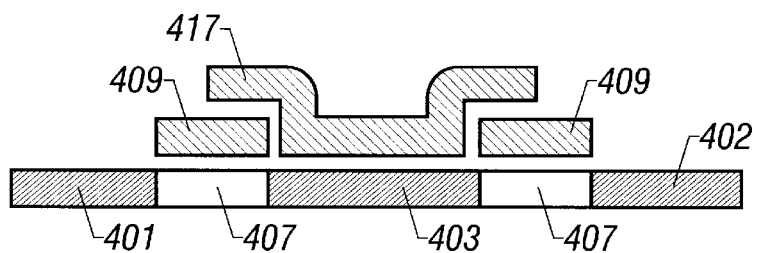
FIG. 15(B) is a sectional view of FIG. 15(A)
Figure 15C:
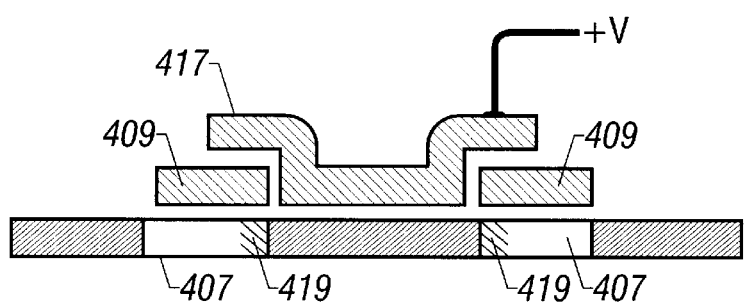
FIG. 15(C) is a sectional view of FIG. 15(A) and is an explanatory view for explaining a thin film semiconductor at a selected time.
Figure 15D:
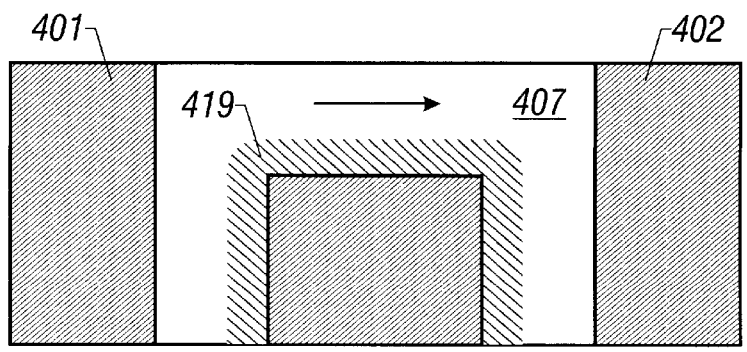
FIG. 15(D) is a top view showing a thin film semiconductor of the semiconductor device of Embodiment 10, and an explanatory view of the thin film semiconductor at the selected time.

FIGS. 15(A) to 15(D) show a thin film semiconductor device of Embodiment 10. FIG. 15(A) is a schematic view, FIGS. 15(B) and 15(C) are sectional views, and FIG. 15(D) is a top view of the thin film semiconductor.

In this embodiment, an overlap gate electrode is provided in the device of the first embodiment as shown in FIG. 1. In FIG. 15, although the structure other than the overlap gate electrode is basically the same as that shown in FIG. 1, in order to simplify the drawing, only one floating island region is shown and the shape of the gate electrode is also simplified in accordance with the simplification of the floating island region.

A gate electrode 409 is formed on a thin film semiconductor 408 formed of intrinsic polycrystal silicon film with a thickness of 100 to 20,000 Å through a gate insulating film not shown.

Further, selective doping of phosphorus with a dose of $1\times10^{12}$ to $1\times10^{14}$ atoms/cm2, preferably $3\times10^{12}$ to $3\times10^{13}$ atoms/cm$^2$, for example, $1\times10^{13}$ atoms/cm$^2$ is carried out for the thin film semiconductor 408, so that a source region 401, a drain region 402, and floating island regions 403 to 406 are formed in the same layer. Doping is not carried out for the base region 407, so that the conductivity thereof remains intrinsic.

Then, an overlap gate electrode 417 is formed on the floating island region 403 through an insulating film not shown. Further, the overlap gate electrode 417 is insulated from the gate electrode 409.

A source wiring/electrode 410 is formed in the source region 401, and a drain wiring/electrode 414 is formed in the drain region 402. The gate electrode 409 is directly electrically connected to a gate wiring 411. A wiring 418 for voltage application is provided to the overlap gate electrode 417.

The semiconductor device of FIGS. 15(A) to 15(D) is structurally the same as the semiconductor device of FIG. 1 added with the overlap gate electrode. Thus, the device satisfies all of the above-mentioned conditions (1) to (7), and therefore is one according to the first to fifth aspects of the present invention.

A reverse bias (negative for n-channel type) voltage is applied to the gate electrode 409 at the non-selected time, so that carriers in accordance with the voltage (holes for n-channel type) are induced in the surface of the base region 407.

In this state, as shown in FIGS. 15(B) and 15(C), when a forward bias (negative for n-channel type) voltage is applied to the overlap gate electrode 417, the carriers in accordance with the voltage (electrons for n-channel type) are extracted from the base region 407 to the floating island region 403, so that a depletion layer 419 is formed. Since the depletion layer 419 is an extremely high resistance region, it does not contribute to conduction.

That is, when the overlap electrode 417 is provided and a forward bias voltage is applied thereto, the width of the substantial base region 407 can be narrowed, and the resistance between source/drain region 401 and 402 in the non-selected state can be further increased. That is, the leak current can be decreased.

On the other hand, in the selected state, a forward bias voltage is applied to not only the gate electrode 409 but also the overlap gate electrode 417, so that the depletion layer 419 is not formed. Rather, a channel is induced in the surface of the base region 407. This state is the same as FIG. 1. That is, when the overlap gate electrode 417 is added and a constant forward bias voltage is applied thereto, only the leak current can be decreased while the drain current of the semiconductor device of FIG. 1 is made to remain.

This embodiment of the present invention is effective especially for the case where the offset region or the low concentration impurity region is included around the circumference of the floating island region. Although the conductivity type of the offset region or the low concentration impurity region is changed by the voltage of the gate electrode, if such regions are not sufficiently inverted, resistance is generated between the base region and the floating island region. Thus, it becomes difficult to flow the drain current so as to cross the base region and the floating island region.

Especially, since the gate electrode does not exist on or below the offset region or low concentration impurity region formed in a self-alignment manner, it is difficult to invert this portion. Of course, if a higher voltage is applied to the gate electrode, the offset region is also sufficiently inverted.

However, when an excessive voltage is applied to the gate electrode, the device may be damaged. Also, the repetition of high voltage application lowers the reliability of the device.

In this embodiment, since a positive voltage is applied to the overlap gate electrode provided to cover the offset region and the low concentration impurity region, the inversion of the offset region and the low concentration impurity region can be accelerated.

[Embodiment 11]

This embodiment will be described with reference to FIGS. 16(A) to 16(F) and FIGS. 17(A) to 17(D). In this embodiment, the formation of a circuit including not only a transistor according to the present invention but also other transistors and wirings will be described.

The main manufacturing steps of the circuit are as follows.

1. Formation of a semiconductor active layer (thin film semiconductor), a gate insulating film, a gate electrode/ wiring, and a gate electrode portion.

2. Doping and activation of doping impurity.

3. Formation of an interlayer insulator.

4. Formation of contact holes to a source region and drain region, and a contact hole to the gate wiring.

5. Formation of a hole for an overlap gate electrode.

6. Formation of wirings (including the overlap gate electrode) using a conductive material (metal etc.) of an upper layer.

In this embodiment, as disclosed in Japanese Patent Publication No. Hei. 6-291315, the surface of the metal gate electrode/wiring is subjected to anodic oxidation, so that it is made the gate electrode portion.

Figure 16A:
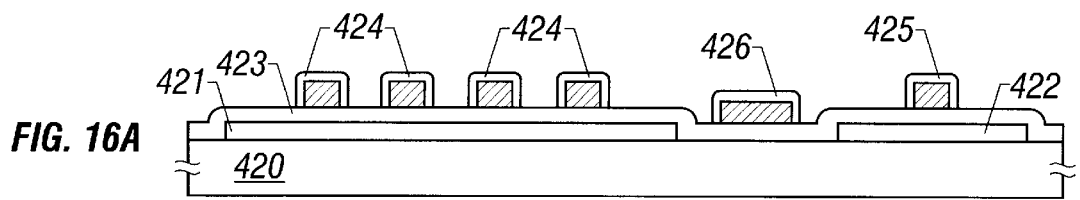
FIGS. 16(A) to 16(F) are views showing manufacturing steps of a semiconductor device of Embodiment 11.

First, step 1 will be described with reference to FIG. 16(A). The thin film semiconductor, gate insulating film, gate electrode/wiring and gate electrode portion are formed by a well-known technique or a technique disclosed in Japanese Patent Unexamined Publication No. Hei. 6-291315.

In this embodiment, a TFT to which the present invention is mainly to be applied, is formed in a thin film semiconductor 421 on a substrate 420, and a TFT to which the present invention is not applied is formed in a thin film semiconductor 422. The former is used for the application requiring a high ON/OFF ratio. In the example of the active matrix type liquid crystal display, the former is a switching transistor for a picture element, a buffer transistor (transfer transistor) for outputting a signal in matrix, or the like. The latter is used for other logic circuit and the like. The thin film semiconductors 421 and 422 are formed on the substrate 420 having an insulating surface.

As a material of the thin film semiconductor 421 and 422, single crystal silicon, polycrystal silicon, amorphous silicon or the like is used. The single crystal silicon includes: one obtained by epitaxial growth on a sapphire substrate; one obtained by a method (SIMOX method) in which high concentration oxygen ions are implanted into the center portion of a single crystal silicon wafer and the portion is oxidized to remain a single crystal silicon layer on only the surface of the wafer; and one obtained by various kinds of lateral epitaxial methods.

The polycrystal silicon includes one obtained by vapor phase growth through well-known various kinds of film growth techniques, and one obtained by applying a laser annealing method, a lamp annealing method, a thermal annealing method or the like to the thus obtained polycrystal silicon or amorphous silicon to further improve the crystallinity.

Gate electrodes 424 and 425, and a gate wiring 426 are formed on the thin film semiconductors 421 and 422 through a gate insulating film 423. As the gate insulating film 423, a silicon oxide film obtained by a manufacturing method used in a normal semiconductor technique is preferable. The surfaces of the gate electrodes/wirings 424 to 426 are covered with an anodic oxidation material. Accordingly, it is necessary that the material of the gate electrodes/wirings 424 to 426 is such that an anodic oxidation film can be formed thereon. For example, a metallic material mainly consisting of aluminum, tantalum and the like is preferable (FIG. 16(A)).

Figure 16B:
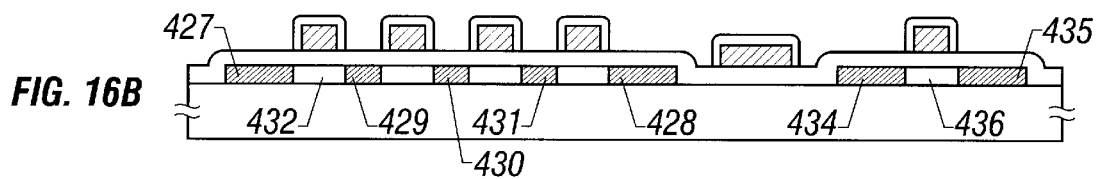

Next, step 2 will be described with reference to FIG. 16(B). This step is carried out by using a well-known impurity doping method. As a result, using the gate electrodes 424 and 425 as masks, n-type source regions 427 and 434, drain regions 428 and 435, and floating island regions 429 to 431 are formed in a self-alignment manner. Further, the thin film semiconductors 421 and 422 just under the gate electrodes 424 and 425 are not doped, so that a base region 432 and a channel region 436 are formed in a self-alignment manner. Further, the impurities introduced into the thin film semiconductor by doping are activated by a well-known method. For example, a thermal annealing method, a laser annealing method, a lamp annealing method or the like is adopted (FIG. 16(B)). (FIG. 17(A))

Figure 17A:
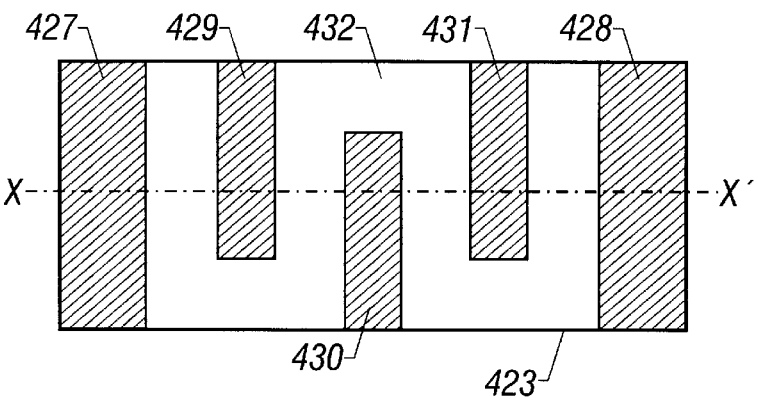
FIGS. 17(A) to 17(D) are views showing an operation principle of the semiconductor device of Embodiment 11.

FIG. 17(A) shows the impurity regions of the thin film semiconductor 421 obtained by this doping, seen from the above. That is, a sectional view taken along line X—X' in the drawing corresponds to FIG. 16(B).

Figure 16C:
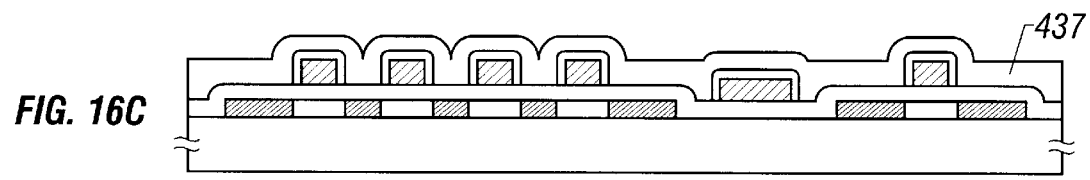

Next, step 3 will be described with reference to FIG. 16(C). This step is carried out by using a well-known interlayer insulator film growth technique, and as a result, an interlayer insulator 437 is formed. A material of the interlayer insulator 437 is selected from materials used for a normal semiconductor technique. For example, silicon oxide, silicon nitride or the like is preferable.

Figure 16D:
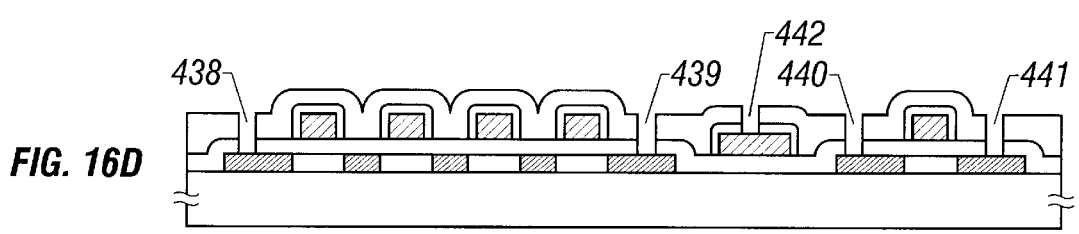

Next, step 4 will be described with reference to FIG. 16(D). This step is carried out by using a well-known contact hole forming technique. As a result, contact holes 438 to 442 for the source regions 427, 434, the drain regions 429 and 435, and the gate wiring 426 are formed.

In the formation of the contact holes, for example, in the formation of the contact hole 442 for the gate wiring 426, the interlayer insulator 437 and the anodic oxidation film around the gate wiring 426 must be etched. On the other hand, in the formation of the other contact holes 438 to 441, the interlayer insulator 437 and the gate insulating film 423 must be etched. Accordingly, etching steps for the contact holes 438 to 441 and 442 may be carried out separately.

Figure 16E:
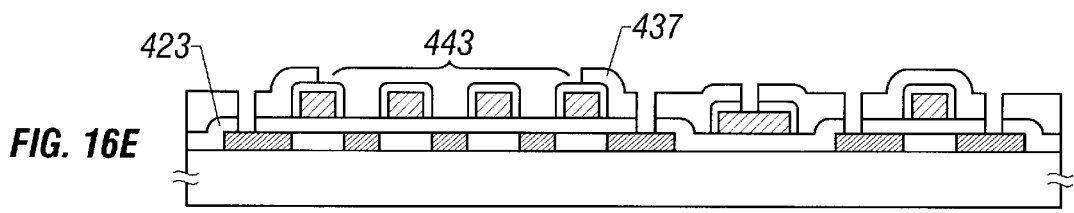

Next, step 5 will be described with reference to FIG. 16(E). This step is also carried out by using a well-known contact hole forming technique. As a result, an opening portion 443 for forming an overlap gate electrode is formed. In this etching step, only the interlayer insulator 437 is etched. When silicon oxide is used for the interlayer insulator, and aluminum is used for the gate electrode 424, since the anodic oxidation material (aluminum oxide) is extremely hard to be etched (selection ratio is large) as compared with silicon oxide, this selective etching can be attained relatively easily. Incidentally, in this etching step, it must be avoided that the gate insulating film 423 is etched.

Figure 16F:
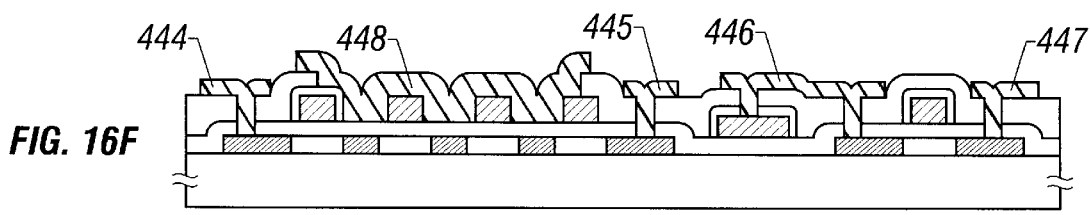

Next, step 6 will be described with reference to FIG. 16(F). This step is carried out by a well-known metal film growth technique and etching technique. As a result, metal wirings 444 to 447 of the source and drain and an overlap gate electrode 448 are formed. As described above, in this embodiment, the overlap gate electrode 448 is formed of the same film as the metal wirings 444 to 447 of the source and drain.

Figure 17B:
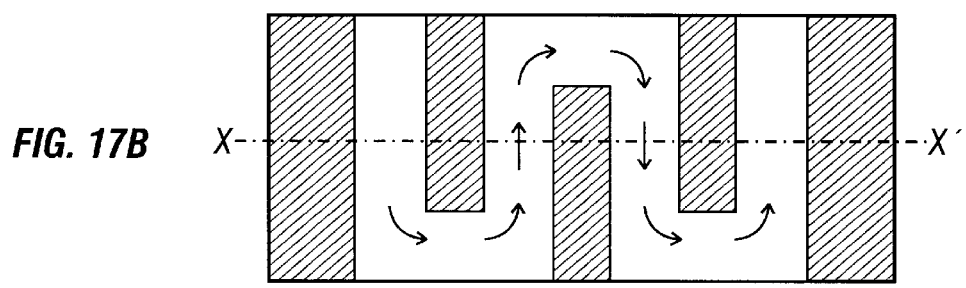

The operation of the thus obtained transistor will be described with reference to FIGS. 17(A) to 17(D). Reference numerals in FIGS. 17(A) to 17(D) correspond to those of FIGS. 16(A) to 16(F). When a negative large voltage is applied to the gate electrode 424 in the state where the source 427 and the overlap gate electrode 448 are grounded and a positive voltage is applied to the drain 428, the leak current flows along the base region 432 as shown in FIG. 17(B).

Figure 17C:
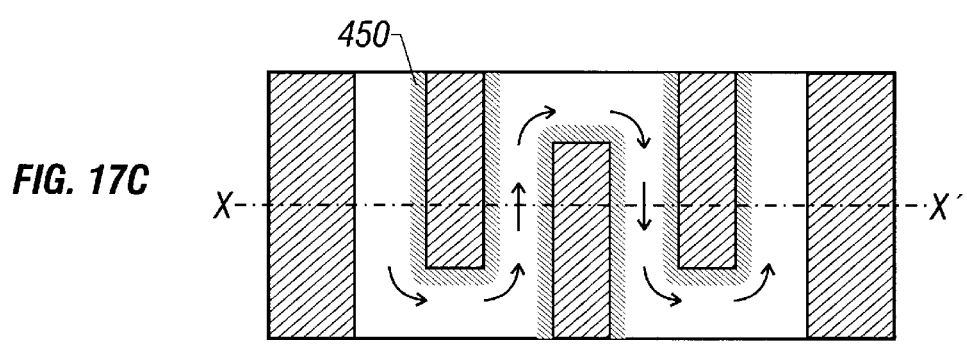

Next, as shown in FIG. 17(C), when a positive voltage is applied to the overlap gate electrode 448, depletion layers 450 are formed around the floating island regions 429 to 431. Since the depletion layers 450 do not contribute to the conduction of the leak current, the width of the conduction path of the leak current becomes narrow and the leak current is decreased.

Figure 17D:
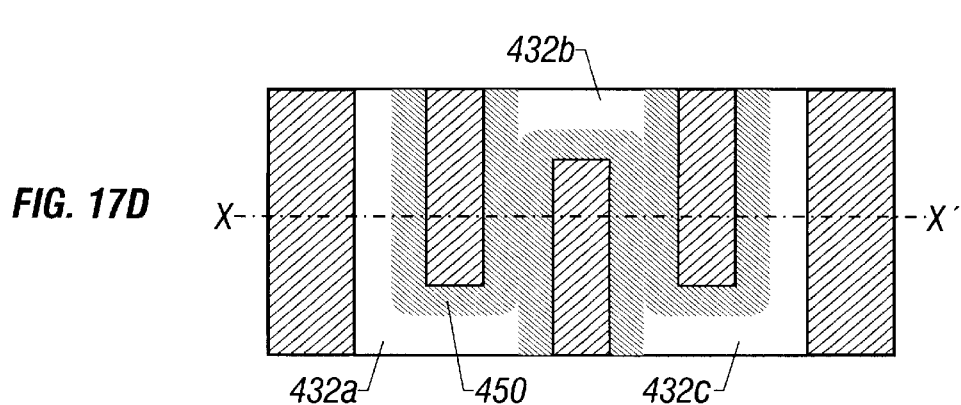

Further, as shown in FIG. 17(D), a large positive voltage is applied to the overlap gate electrode 448, the depletion layers 450 around the floating island regions 429 to 431 are enlarged and coupled with each other as shown in the drawing. As a result, the base region 432 is divided into three regions 432a to 432c. In such a state, since the leak current can no longer flow, the leak current is extremely decreased.

The above method is applied not only to the TFT disclosed in Japanese Patent Unexamined Publication No. Hei. 6-291315. As shown in FIG. 12(D), it is apparent that the above method can be practiced for a TFT in which an offset region or a low concentration impurity region is formed by using the anodic oxidation technique for a side surface as disclosed in Japanese Patent Unexamined Publication No. Hei. 7-169974.

[Embodiment 12]

This embodiment will be described with reference to FIGS. 18(A) to 18(E). Similarly to Embodiment 11, also in this embodiment, the formation of a circuit including not only a transistor according to the present invention but also other transistors and wirings will be described.

The main manufacturing steps of the circuit according to this embodiment are as follows.

1. Formation of a semiconductor active layer (thin film semiconductor), a gate insulating film, a gate electrode/wiring, and a gate electrode portion.
2. Doping and activation of doped impurities.
3. Formation of an interlayer insulator.
4. Formation of contact holes to a source region and a drain region, and a hole for an overlap gate electrode.
5. Formation of a contact hole for a gate electrode.
6. Formation of wirings (including the overlap gate electrode) using a conductive material (metal etc.) of an upper layer.

In this embodiment, as disclosed in Japanese Patent Unexamined Publication No. Hei. 6-291315, the surface of a metal gate electrode/wiring is subjected to anodic oxidation to form a gate electrode portion. However, this embodiment can be applied not only to a TFT as disclosed in Japanese Patent Unexamined Publication No. Hei. 6-291315, but can be applied similarly to a TFT in which an offset region or a low concentration impurity region is formed by using the anodic oxidation technique for a side surface as disclosed in Japanese Patent Unexamined Publication No. Hei. 7-169974.

Figure 18A:
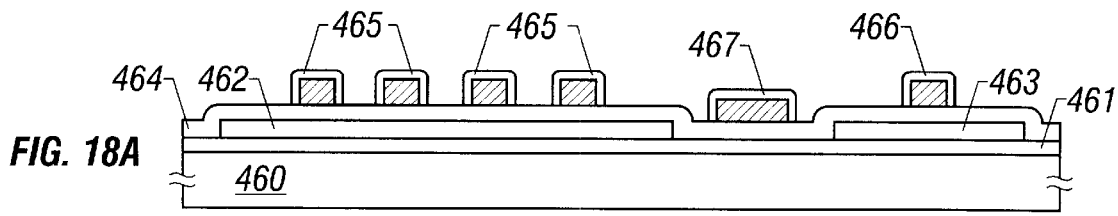
FIGS. 18(A) to 18(E) are views showing manufacturing steps of a semiconductor device of Embodiment 12.

First, step 1 will be described with reference to FIG. 18(A). A TFT to which the present invention is mainly to be applied is formed in a thin film semiconductor 462, and a TFT to which the present invention is not applied is formed in a thin film semiconductor 463. The thin film semiconductors 462 and 463 are formed on a SIMOX substrate 460. The SIMOX substrate 460 is obtained in such manner that oxygen ions are implanted into the vicinity of a substrate of single crystal silicon wafer only at a predetermined depth, so that a silicon oxide layer 461 is formed near the surface of the substrate, and a single crystal silicon layer is made to remain thereon. Accordingly, the thin film semiconductors 462 and 463 can be formed by etching the single crystal silicon layer on the silicon oxide layer 461.

A gate insulating film 464 is formed to cover the thus obtained thin film semiconductors 462 and 463, and gate electrodes 465 and 466 and a gate insulating wiring 467 are formed on the gate insulating film 464. In this embodiment, silicon oxide formed by a plasma CVD method is used for the gate insulating film 464, and aluminum (including 0.1 to 3% scandium) is used for the gate electrodes/wirings 465 to 467. The surfaces of the gate electrodes/wirings 465 to 467 are coated with an anodic oxidation material (FIG. 18(A)).

Figure 18B:
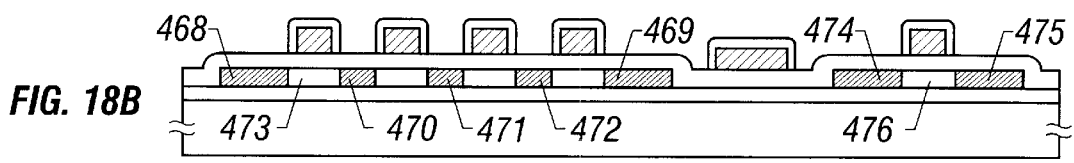

Next, step 2 will be described with reference to FIG. 18(B). This step is carried out by using a well-known impurity doping method. As a result of using the gate electrodes 465 and 466 as masks, n-type source regions 468 and 474 drain regions 469 and 476, and floating island regions 470 to 472 are formed in a self-alignment manner. The regions just under the gate electrodes 465 and 466 of the thin film semiconductors 462 and 463 are not doped, so that a base region 473 and a channel region 476 are formed. The impurities introduced into the thin film semiconductor by doping are activated by a well-known method. In this embodiment, laser annealing using an excimer laser is adopted (FIG. 18(B)).

Figure 18C:
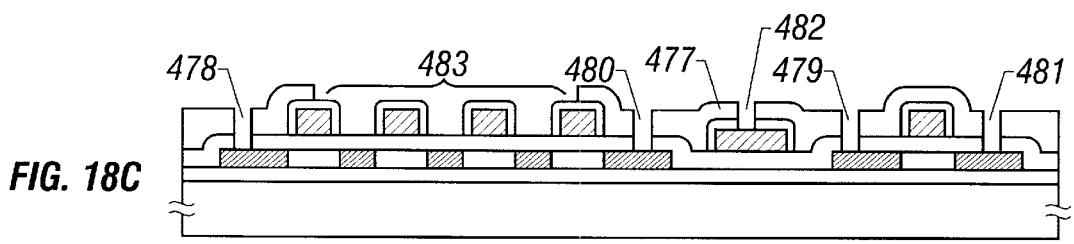

Next, steps 3 and 4 will be described with reference to FIG. 18(C). These steps are carried out by using a well-known interlayer insulator film forming technique and a contact hole forming technique. In this embodiment, silicon oxide is used for an interlayer insulator 477. Further, contact holes 478 to 482 to the source regions 468 and 474, the drain regions 469 and 475, and the gate wiring 467 are formed. At the same time, an opening 483 forming an overlap gate electrode is formed. In the above steps, by dry etching, etching is performed until the gate insulating film 464 is etched. However, since the anodic oxidation material (aluminum oxide) around the gate electrodes/wirings 465 to 467 has an etching rate extremely low as compared with silicon oxide, the anodic oxidation material is not etched in these steps, and the anodic oxidation material becomes a stopper for etching (FIG. 18(C)).

Figure 18D:
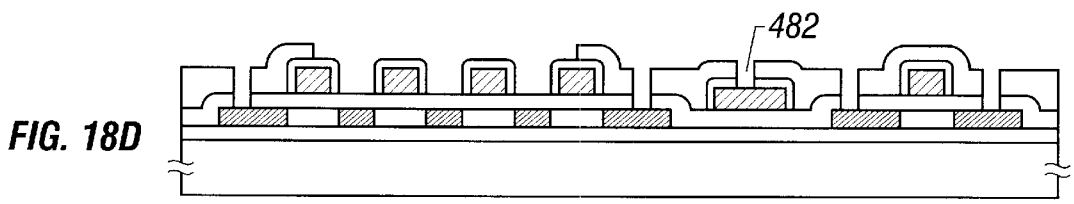

Next, step 5 will be described with reference to FIG. 18(D). In this step, only the contact hole 482 is exposed and remaining portions are covered with a mask of photoresist, and the anodic oxidation material around the gate wiring 467 is etched by a wet etching method. As a result, a contact hole 482 reaching the gate wiring 467 is formed (FIG. 18(D)).

Figure 18E:
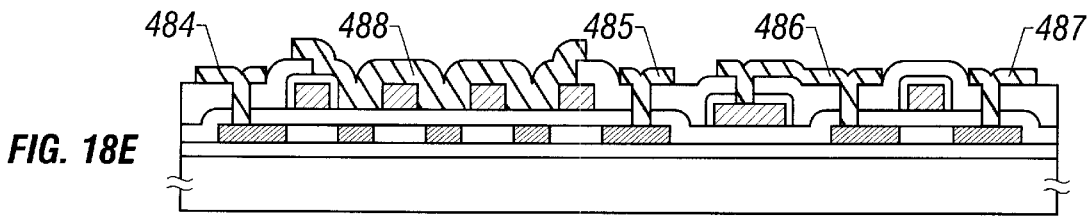

Next, step 6 will be described with reference to FIG. 18(E). This step is carried out by a well-known metal film forming technique and an etching technique. As a result, metal wirings 484 to 487 and an overlap gate electrode 488 are formed (FIG. 18(E)).

[Embodiment 13]

This embodiment will be described with reference to FIG. 19. Similarly to Embodiments 11 and 12, also in this embodiment, manufacturing steps of a circuit including not only a transistor according to the present invention but also other transistors and wirings will be described.

The main manufacturing steps of the circuit according to this embodiment are as follows.

1. Formation of a semiconductor active layer (thin film semiconductor), a gate insulating film, a gate electrode/wiring, and a gate electrode portion.
2. Doping and activation of doped impurities.
3. Formation of an overlap gate electrode.
4. Film formation of an interlayer insulator.
5. Formation of contact holes to source and drain regions and a contact hole to a gate wiring.
6. Formation of wirings using a conductive material (metal etc.) of an upper layer.

In this embodiment, as disclosed in Japanese Patent Unexamined Publication No. Hei. 6-291315, the surface of a metal gate electrode/wiring is subjected to anodic oxidation to form a gate electrode portion. However, this embodiment is not limited to a TFT disclosed in Japanese Patent Unexamined Publication No. Hei. 6-291315, but it can be similarly practiced also for a TFT in which an offset region or a low concentration impurity region is formed by using the anodic oxidation technique of a side surface as disclosed in Japanese Patent Unexamined Publication No. Hei. 7-169974.

Figure 19A:
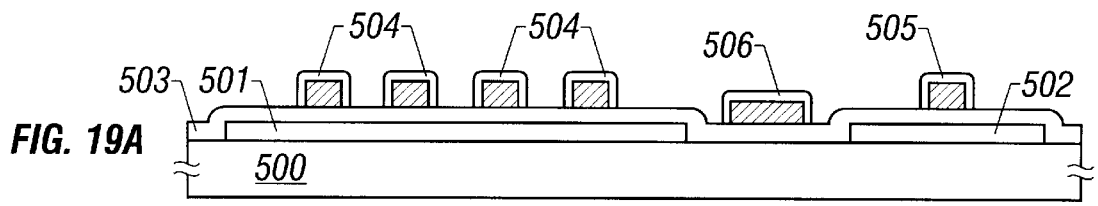
FIGS. 19(A) to 19(F) are views showing manufacturing steps of a semiconductor device of Embodiment 13.

First, step 1 will be described with reference to FIG. 19(A). A TFT to which the present invention is mainly to be applied is formed in a thin film semiconductor 501, and a TFT to which the present invention is not applied is formed in a thin film semiconductor 502. The thin film semiconductors 501 and 502 are formed on an insulating substrate 500. In this embodiment, as the thin film semiconductor, a polycrystal silicon film crystallized by a laser annealing method is used.

A gate insulating film 503, gate electrodes 504 and 505, and a gate wiring 506 are formed to cover such a thin film semiconductor. In this embodiment, silicon oxide formed by a reduced pressure CVD method is used as the gate insulating film 503, and aluminum (including 0.1 to 3% scandium) is used as gate electrodes/wirings 504, 505 and 506. The surfaces of the gate electrodes/wirings 504, 505 and 506 are covered with an anodic oxidation material (FIG. 19(A)).

Figure 19B:
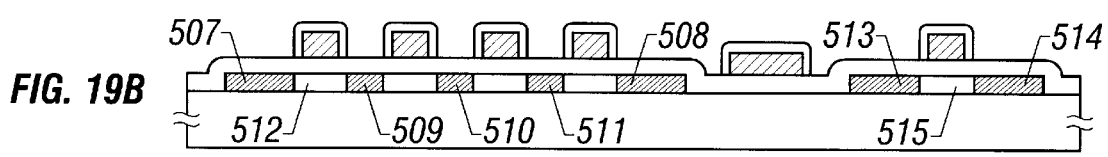

Next, step 2 will be described with reference to FIG. 19(B). This step is carried out by a well-known impurity doping method. As a result of using the gate electrodes 504 and 505 as masks, n-type source regions 507 and 513, drain regions 508 and 514, and floating island regions 508 to 511 are formed in a self-alignment manner. Further, the regions just under the gate electrodes 504 and 505 of the thin film semiconductors 501 and 502 are not doped, so that a base region 512 and a channel region 515 are formed.

Impurities introduced into the thin film semiconductor 501 and 502 by doping are activated by a well-known method. In this embodiment, a laser annealing method using an excimer laser is adopted (FIG. 19(B)).

Figure 19C:
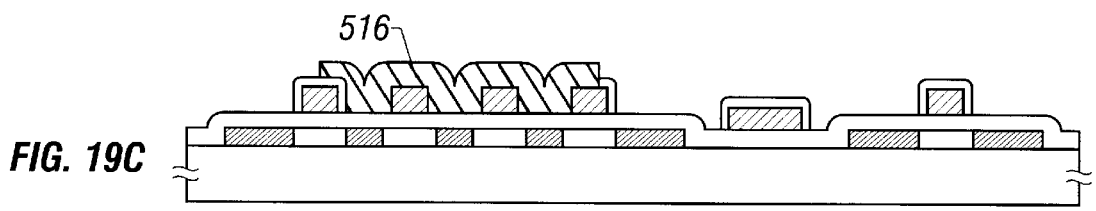

Next, step 3 will be described with reference to FIG. 19(C). In this step, by a well-known metal film forming technique and an etching technique, an overlap gate electrode 516 is formed so as to cover the floating island regions 509 to 511 (FIG. 19(C)).

Figure 19D:
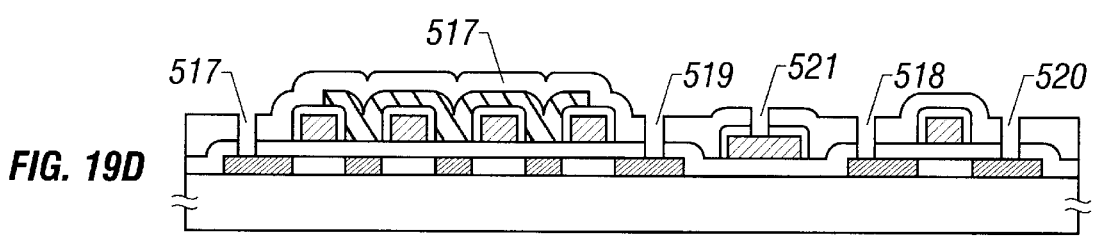

Next, steps 4 and 5 will be described with reference to FIG. 19(D). This step is carried out by a well-known interlayer insulator film forming technique and a contact hole forming technique. In this embodiment, silicon oxide is used as an interlayer insulator 517 (FIG. 19(D)).

Then, the interlayer insulator 517 is etched to form contact holes 517 to 521 to the source regions 507 and 513, the drain regions 508 and 514, and the gate wiring 506. The above-mentioned etching step may be divided into a plurality of steps (FIG. 19(D)).

Figure 19E:
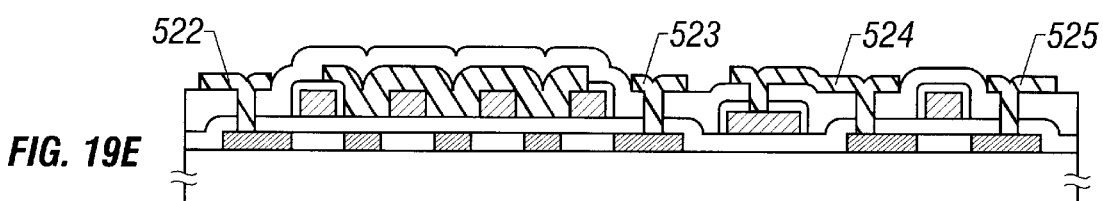

Next, step 6 will be described with reference to FIG. 19(E). This step is carried out by using a well-known metal film forming technique and an etching technique. As a result, metal wirings 522 to 525 connected to the source regions 507 and 513, the drain regions 508 and 514, the gate wiring 506 are formed (FIG. 19(E)).

In this embodiment, as compared with Embodiments 11 and 12, although one more metal wiring layer is further added, the overlap gate electrode 516 and the metal wirings 522 to 525 can be intersected with each other.

Figure 19F:
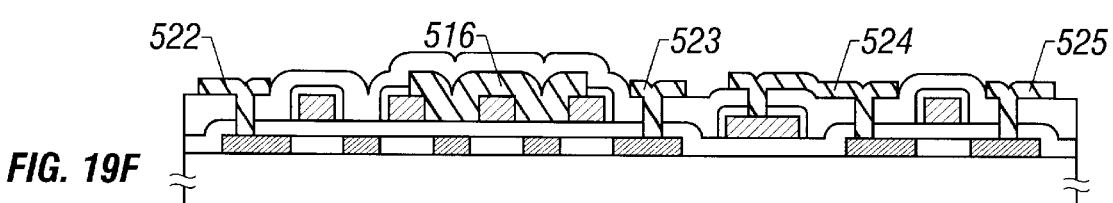

Further, the overlap gate electrode 516 may be formed so that it covers only the floating island regions 510 and 511 as shown in FIG. 19(F). This modification does not lose the effect of the present invention.

[Embodiment 14]

This embodiment will be described with reference to FIG. 20. The main manufacturing steps of a transistor according to this embodiment are as follows.

1. Formation of a semiconductor active layer (thin film semiconductor), an insulating film, a gate electrode/wiring, and a gate electrode portion.

2. Doping and activation of doped impurities.
3. Formation of a film for etching stopper.
4. Film formation of an interlayer insulator.
5. Formation of contact holes to source and drain regions, and a hole for an overlap gate.
6. Formation of wirings (including the overlap gate electrode) using a conductive material (metal etc.) of an upper layer.

In this embodiment, as disclosed in Japanese Patent Unexamined Publication No. Hei. 6-291315, the surface of a metal gate electrode/wiring is subjected to anodic oxidation to form a gate electrode portion. However, this embodiment can be applied not only to a TFT disclosed in Japanese Patent Unexamined Publication No. Hei. 6-291315, but it can be similarly practiced also for a TFT in which an offset region or a low concentration impurity region is formed by using the anodic oxidation technique of a side surface as disclosed in Japanese Patent Unexamined Publication No. Hei. 7-169974.

Figure 20A:
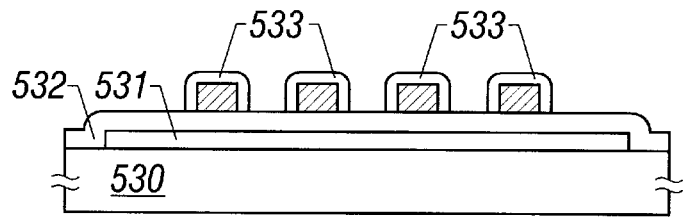
FIGS. 20(A) to 20(F) are views showing manufacturing steps of a semiconductor device of Embodiment 14.

First, step 1 will be described with reference to FIG. 20(A). A TFT to which the present invention is mainly to be applied is formed in a thin film semiconductor 531. The thin film semiconductor 531 is formed on an insulating substrate 530.

A gate insulating film 532 and a gate electrode 533 are formed so as to cover such a thin film semiconductor. In this embodiment, silicon oxide formed by a reduced pressure CVD method is used as the gate insulating film 532, and aluminum (including 0.1 to 3% scandium) is used as the gate electrode 533. The surface of the gate electrode 533 is covered with an anodic oxidation material (FIG. 20(A)).

Figure 20B:
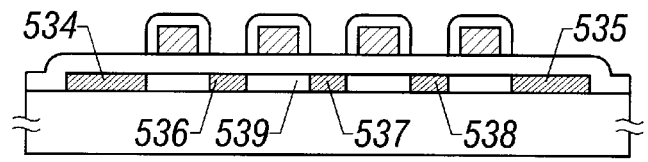

Next, step 2 will be described with reference to FIG. 20(B). This step is carried out by a well-known impurity doping method. As a result of using the gate electrode 533 as a mask, a source region 534, a drain region 535, and floating island regions 536 to 538 are formed in a self-alignment manner. Further, a region just under the gate electrode of the thin film semiconductor 531 is not doped, so that a base region 539 is formed. Further, impurities introduced into the thin film semiconductor by doping are activated by a well-known method. In this embodiment, a laser annealing method using an excimer laser is adopted (FIG. 20(B)).

Figure 20C:
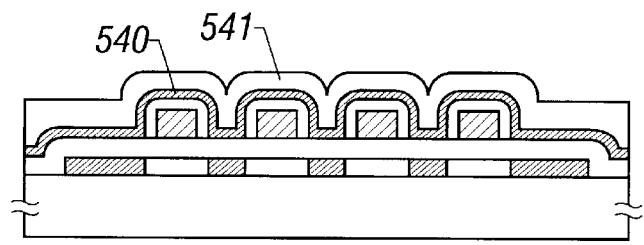

Next, steps 3 and 4 will be described with reference to FIG. 20(C). In this step, by a well-known metal film forming technique, a silicon nitride film 540 is formed to cover the floating island regions 536 to 538. Further, an interlayer insulator 541 of silicon oxide is also formed (FIG. 20(C)).

Figure 20D:
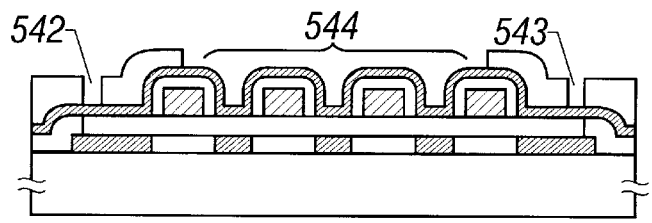
Figure 20E:
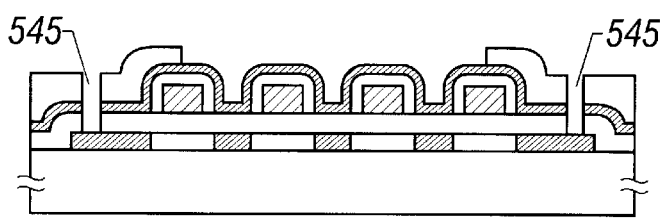

Next, step 5 will be described with reference to FIG. 20(D). This step is carried out by a well-known contact hole forming technique. The interlayer insulator 541 is etched to form contact holes 542 and 543 to the source region 534 and the drain region 535, and a hole 544 for an overlap gate electrode. This etching step is conducted such that, using the difference of etching rates of silicon oxide and silicon nitride, etching stops at the silicon nitride film 540 (FIG. 20(D)).

Thereafter, the silicon nitride film 540 and the gate insulating film 532 are etched in the state where only the contact holes 542 and 543 are exposed, and remaining portions are covered with a photoresist. In this way, contact holes 544 and 545 reaching the source region 534 and drain region 535 are obtained (FIG. 20(E)).

Figure 20F:
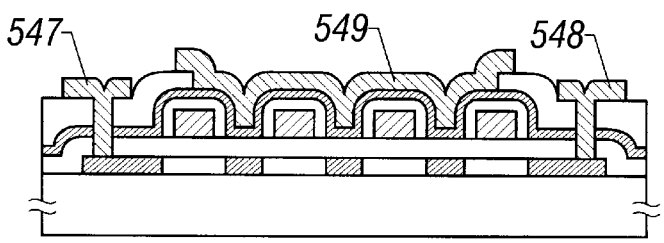

Next, step 6 will be described with reference to FIG. 20(F). This step is carried out using a well-known metal film forming technique and an etching technique. As a result, a source electrode/wiring 547, a drain electrode/wiring 548, and an overlap gate electrode 549 are formed (FIG. 20(F)).

Although this embodiment is similar to Embodiments 11 and 12, it is characterized in that the silicon nitride film 540 is newly provided as an etching stopper. In Embodiments 11 and 12, when the holes (443, 483) for the overlap gate electrode are provided, there is a danger that the gate insulating films (423, 464) are etched. However, as in this embodiment, if the silicon nitride film 540 serving as the etching stopper is provided, such a problem can be eliminated.

Further, although the silicon nitride is apt to trap positive charges, when considering that the overlap gate electrode 547 is always kept a positive potential in an n-channel type transistor, no problem arises. Such a silicon nitride is rather preferable, because there is such an effect that the depletion layer is enlarged by the trapped charges in addition to the applied voltage.

[Embodiment 15]

This embodiment will be described with reference to FIGS. 21(A) to 21(F). A transistor according to this embodiment is of a bottom gate type in which a gate electrode is positioned at a substrate side, contrary to Embodiments 11 to 14. The main manufacturing steps of a semiconductor device according to this embodiment are as follows.

1. Formation of a gate electrode/wiring, a gate insulating film, and a semiconductor active layer (thin film semiconductor).
2. Formation of a doping mask.
3. Doping and activation of doped impurities.
4. Film formation of an interlayer insulator.
5. Formation of contact holes to source and drain regions.
6. Formation of wirings (including an overlap gate electrode) using a conductive material (metal etc.) of an upper layer.

In this embodiment, as disclosed in Japanese Patent Unexamined Publication No. Hei. 5-275419 or No. Hei. 7-99317, in order to obtain a bottom gate type thin film semiconductor, formation of a doping mask in a self-alignment manner, ion doping into a thin film semiconductor and activation are carried out. The above publications may be referred to with respect to detailed conditions, thickness of coating films and the like according to this embodiment.

Figure 21A:
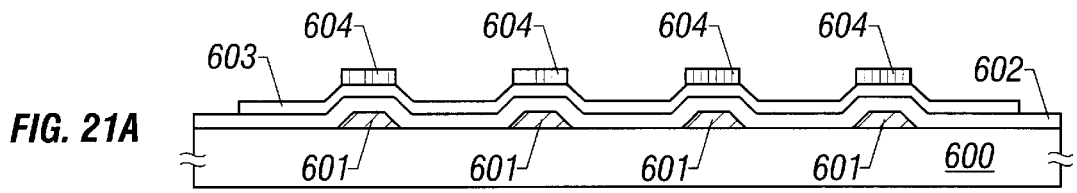
FIGS. 21(A) to 21(F) are views showing manufacturing steps of a semiconductor device of Embodiment 15.
Figure 21B:
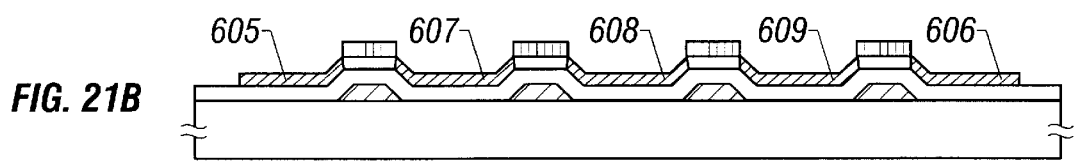

First, step 1 will be described with reference to FIG. 21(A). Gate electrodes 601 are formed on a glass substrate 600. The glass substrate 600 is required to be transparent for light used for light exposure since a rear surface exposure technique is used.

Aluminum (including 0.1 to 2% silicon) is used as the gate electrodes 601. The gate electrodes 601 in the drawing are obtained from the same film, and electrically connected to each other. In order to increase a withstand voltage, anodic oxidation material coating films may be formed on the upper surface and the side surface of the gate electrode 601 by an anodic oxidation method. Further, a gate insulating film 602 of silicon oxide and a thin film semiconductor 603 of a polycrystal or amorphous silicon film are formed thereon. In this embodiment, the silicon oxide is formed by a reduced pressure CVD method, and the amorphous silicon film is formed by a plasma CVD method, which is crystallized by a laser annealing method.

Next, step 2 will be described. This step uses the rear surface exposure technique. That is, a film of silicon nitride is deposited, and a photoresist is coated thereon, then light irradiation from the rear surface is carried out to expose the photoresist. According to this, the silicon nitride film is etched to obtain doping masks 604. The doping masks 604 appear to be separate from each other in the drawing. However, since the rear surface exposure technique is adopted, all masks are connected to each other like the gate electrodes 601 (FIG. 21(B)).

Next, step 3 will be described. This step is carried out by using the doping mask 604 and a well-known impurity doping method. As a result, a source region 605, a drain region 606, and floating island regions 607 to 609 are formed as impurity regions in a self-alignment manner. At the same time, a region in which impurities are not doped becomes a base region. Further, impurities introduced into the thin film semiconductor by doping are activated by a lamp annealing method.

Figure 21C:
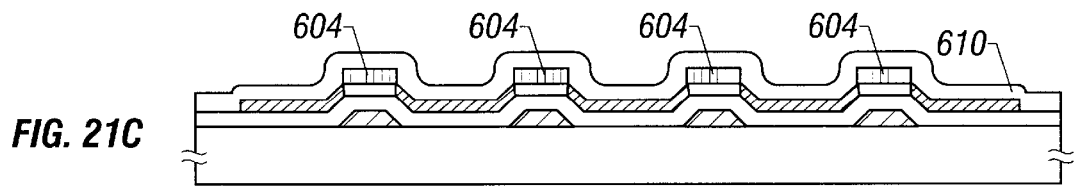

Next, step 4 will be described with reference to FIG. 21(C). In this step, by a well-known insulating film forming technique, a silicon nitride film as an interlayer insulator 610 is formed so as to cover the thin film semiconductor 603 and the doping mask 604. Since the interlayer insulator 610 is used for not only interlayer insulation but also a gate insulating film of an overlap gate electrode, it should be avoided to grow excessively the thickness thereof. For example, when the insulator is silicon nitride, the thickness of 1,000 to 3,000 Å is preferable (FIG. 21(C)).

Figure 21D:
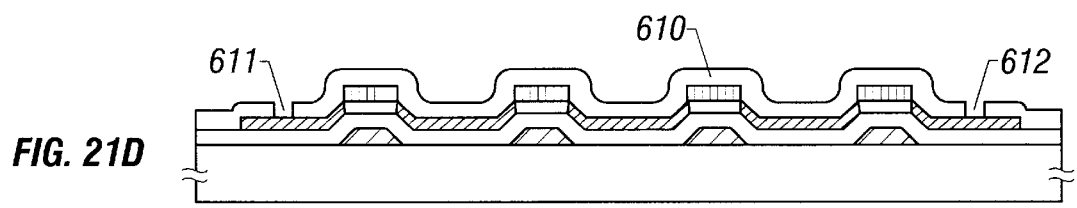

Next, step 5 will be described with reference to FIG. 21(D). This step is carried out by a well-known contact hole forming technique. The interlayer insulator 610 is etched to form contact holes 611 and 612 to the source region 605 and the drain region 606 (FIG. 21(D)).

Next, step 6 will be described with reference to FIG. 21(E). This step is carried out by using a well-known metal film forming technique and an etching technique. As a result, a source electrode/wiring 613, a drain electrode/wiring 614, and an overlap gate electrode 615 are formed (FIG. 21(E)).

Figure 21E:
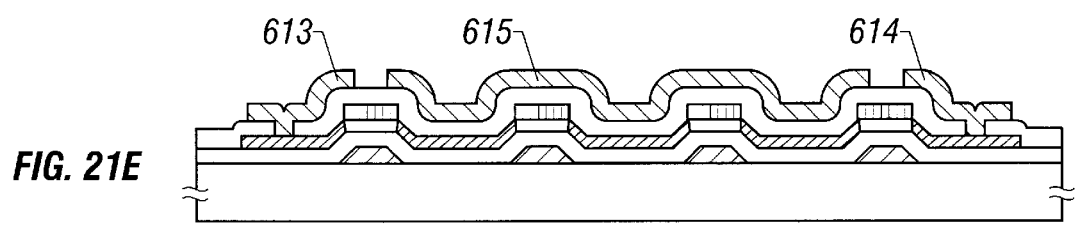
Figure 21F:
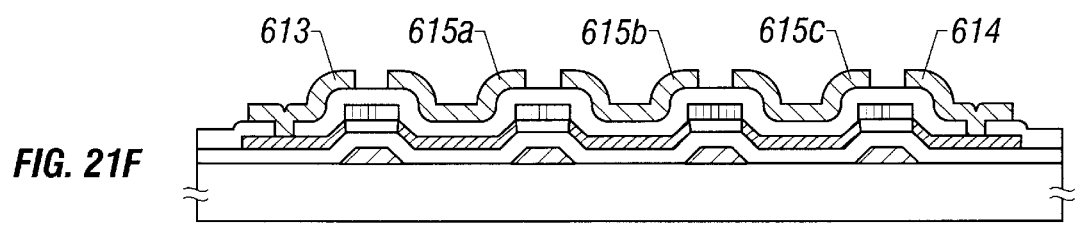

The overlap gate electrode 615 may be continuous as in FIG. 21(E), or separate overlap gate electrodes 615a to 615c may be formed for the respective floating island regions 607 to 609 as shown in FIG. 21(F).

The former is effective when the doping mask 604 is sufficiently thick. In such a case, since the doping mask 604 exists, even if a forward bias voltage is applied to the overlap gate electrode 615, a channel is not formed in the base region (portion where doping is not conducted) (FIG. 21(F)).

In case the doping mask 604 is not sufficiently thick, since a channel is formed in the base region, in order to prevent it, as shown in FIG. 21(F), it is necessary to divide the overlap gate electrode so that the overlap gate electrodes 615a to 615c do not cross the base region (that is, the overlap gate electrode 615 exists to correspond to the respective floating island regions 607 to 609).

[Embodiment 16]

This embodiment will be described with reference to FIGS. 22(A) to 22(D). A transistor according to this embodiment is of a so-called top gate type in which a gate electrode is positioned on a thin film semiconductor. However, contrary to Embodiments 11 to 14, the transistor is of a type (positive stagger type) in which a source electrode/wiring and a drain electrode/wiring are positioned under the thin film semiconductor, that is, contrary to the gate electrode. The main manufacturing steps of a semiconductor device according to this embodiment are as follows.

1. Formation of a source electrode/wiring and a drain electrode/wiring, and a semiconductor active layer (thin film semiconductor).
2. Formation of a gate insulating film and a gate electrode.
3. Doping and activation of doped impurities.
4. Film formation of an interlayer insulator.
5. Formation of an overlap gate electrode.

Figure 22A:
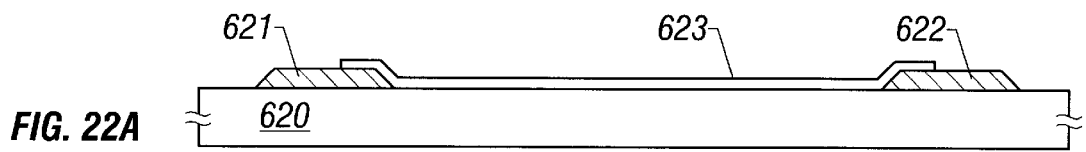
FIGS. 22(A) to 22(D) are views showing manufacturing steps of a semiconductor device of Embodiment 16.
Figure 22B:
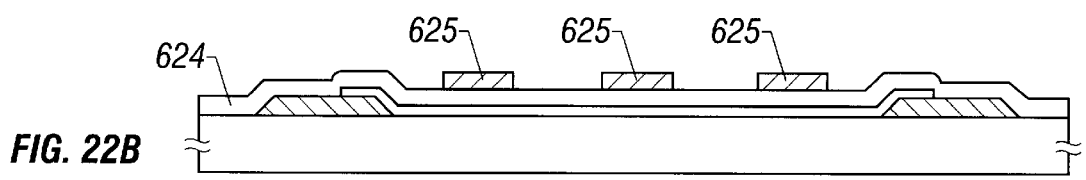
Figure 22C:
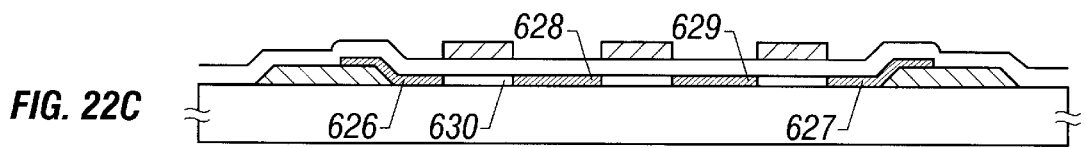
Figure 22D:
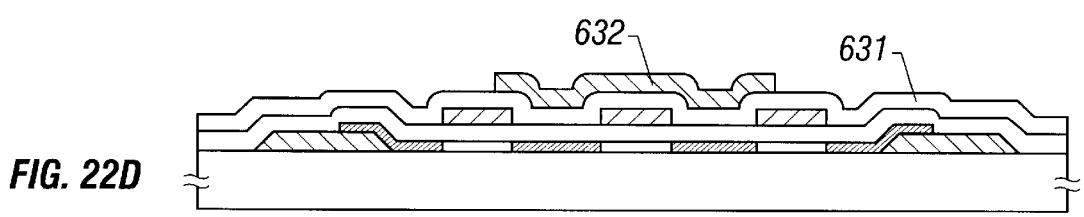

First, step 1 will be described with reference to FIG. 22(A). A source electrode/wiring 621 and a drain electrode/ wiring 622 are formed on a glass substrate 620. Molybdenum is used as the source electrode/wiring 621 and the drain electrode/wiring 622. Other relatively high heat-resistant metal (tungsten, chromium, tantalum, nickel, etc.) may be used. Further, an amorphous silicon film 623 is formed thereon, which is crystallized by a laser annealing method (FIG. 22(A)).

Next, step 2 is carried out. In this step, a gate insulating film 624 of silicon oxide, and gate electrodes 625 of aluminum are formed by a well-known film forming technique (FIG. 22(B)).

Next, step 3 is carried out. This step is carried out by using a well-known impurity doping method. Using the gate electrodes 625 as masks, a source region 626, a drain region 627, and floating island regions 628 and 629 are formed as impurity regions in a self-alignment manner. Regions just under the gate electrodes 625 are not doped with impurities so that they become base regions 630. Further, impurities introduced into the thin film semiconductor by doping are activated by a laser annealing method (FIG. 22(C)).

Next, step 4 is carried out. In this step, by a well-known insulating film forming technique, a silicon oxide film as an interlayer insulator 631 is formed so as to cover the gate electrodes 625. The interlayer insulator 631 is required to be so thick that the insulation between the gate electrodes 625 and the overlap gate electrode 632 formed thereon can be kept, and at the same time, it is required to be so thin that an electric field acts on the lower floating island regions 628 and 629 through the interlayer insulator 631 and the gate insulating film 624. Accordingly, when the silicon oxide is used, it is desired to set such a thickness as is obtained by subtracting a thickness of the gate insulating film 624 from 2,000 to 3000 Å.

Next, step 5 is carried out. This step is carried out by a well-known metal film forming technique and an etching technique. As a result, an overlap gate electrode 632 is formed (FIG. 22(D)).

[Embodiment 17]

Embodiments 17 to 23 described below are characterized in that a block region is provided in a base region. It is conventionally proposed to decrease a leak current by providing an offset region corresponding to the block region of the present invention. The conventional offset region is provided in series to a channel region between a source and a drain. However, in such an arrangement, even in the selected state, a drain current must pass through the offset region, the drain current is also decreased by the resistance of the offset region. That is, since the drain current is also decreased at the same time as the decrease of the leak current, the ON/OFF ratio is not improved.

Also in these embodiments, a block region is formed in series to a base region between a source and a base region. In the non-selected state, since a leak current flows via the base region, the leak current is decreased, corresponding to the increase of resistance of the base region by the block region.

On the other hand, in the selected state, a drain current flows via the base region and floating island regions. Although the block region is a resistive component, since it is inserted not in series but in parallel, the drain current is not decreased by the block region. That is, in the present invention, the ON/OFF ratio can be improved. This is a new effect obtained by combination of the feature that the paths of the leak current (non-selected state) and the drain current (selected state) are different, and the offset region (block region).

Figure 23A:
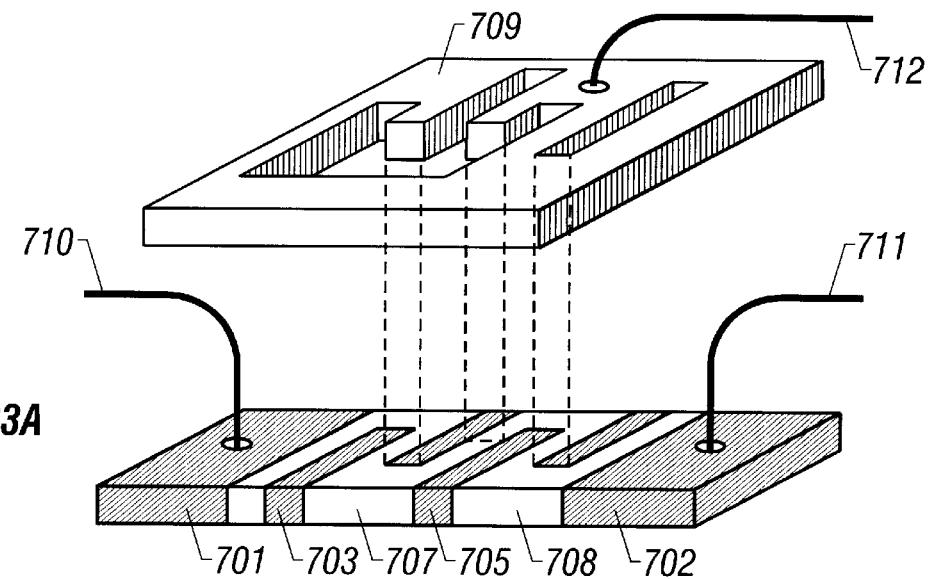
FIGS. 23(A) to 23(C) are views showing an operation of a semiconductor device of Embodiment 17.

FIG. 23(A) schematically shows a semiconductor device according to this embodiment. In this embodiment, the concept of a block region according to the present invention is introduced into the thin film semiconductor device shown in FIG. 6. That is, after doping, a part of the gate electrode is removed so that the block region is obtained (FIG. 23(A)).

Figure 23B:
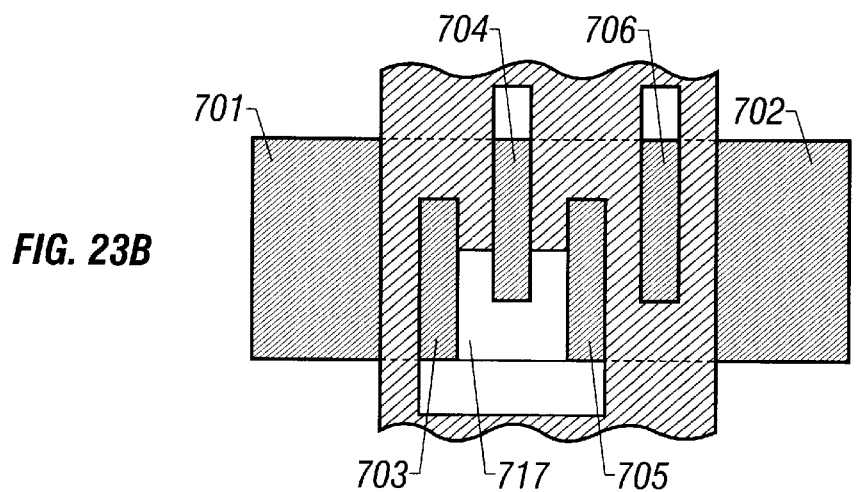
Figure 23C:
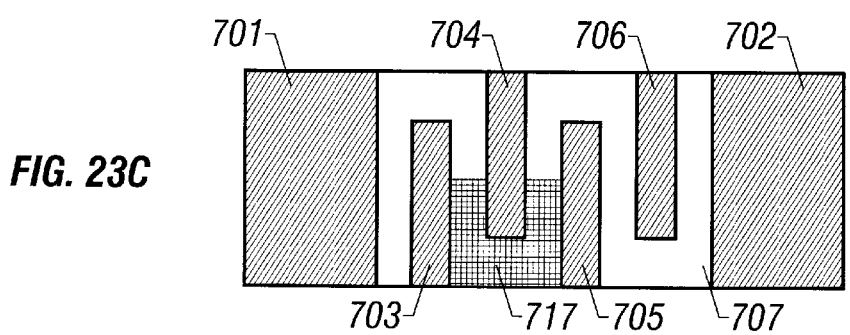

FIG. 23(B) is a top view of the thin film semiconductor device according to this embodiment, and FIG. 23(C) is a view showing only thin film semiconductor of the device shown in FIGS. 23(A) and 23(B) seen from the above.

A source region 701, a drain region 702, floating island region 703 to 706, a base region 707, and a blocking region 717 are formed in the same layer of a thin film semiconductor 708.

Further, on the thin film semiconductor 708, a gate electrode 709 is formed through a gate insulating film not shown.

Here, in order to make the conductivity type of the source/drain regions 701 and 702, and the floating island regions 703 to 706 into an n-type, selective doping of phosphorus with a dose of $1\times10^{12}$ to $1\times10^{14}$ atoms/cm$^2$, preferably $3\times10^{12}$ to $3\times10^{13}$ atoms/cm$^2$, for example, $1\times10^{13}$ atoms/cm$^2$ is carried out for the thin film semiconductor 708 formed of an intrinsic polycrystal silicon film with a thickness of 100 to 20,000 Å. On the other hand, doping is not carried out for the base region 707, so that the conductivity of the base region 707 is intrinsic.

After doping, a part of the gate electrode 709 is removed, so that a block region 717 is formed in the base region 707.

As shown in FIG. 23(B), since the part of the gate electrode 709 is removed, a part of the base region 707 can be seen. That is, this is the block region 717.

The block region 717 is formed so as to divide a path of the base region 707 (FIG. 23(C)).

Further, a source wiring/electrode 710 is formed on the source region 701, and a drain wiring/electrode 711 is formed on the drain region 702. The gate electrode 709 is directly electrically connected to the gate wiring 712.

Figure 24A:
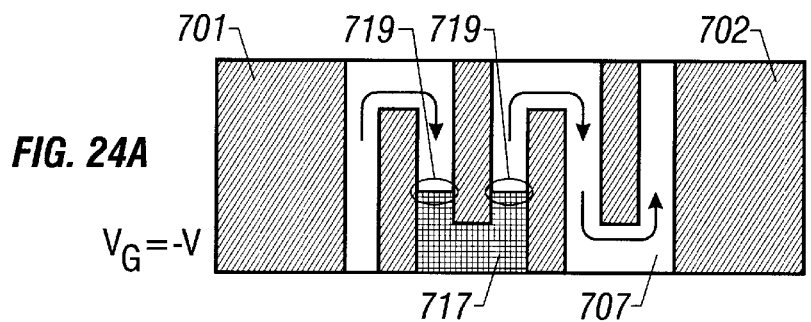
FIGS. 24(A) to 24(E) are views showing the operation of the semiconductor device of Embodiment 17.
Figure 24B:
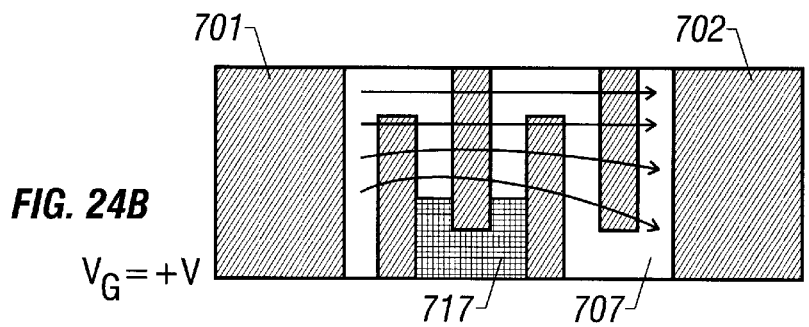

FIGS. 24(A) and 24(B) show the flow of a current in the semiconductor device having the structure shown in FIGS. 23(A) to 23(C). Here, although the case of an n-channel type is shown, the same explanation can be made even for the case of a p-channel type if the polarity is inverted.

FIG. 24(A) shows the non-selected (OFF) state, and the flowing current is the leak current. As shown by arrows in the drawing, in the non-selected state, the leak current flows in the base region 707 zigzagging from the source region 701 to the drain region 702 while avoiding the floating island regions 703 to 705. In this case, the apparent channel has a length L and a width W. The substantial channel based on the flow of the real leak current has a length longer than that of the apparent channel and a width narrower than that of the apparent channel. The above description is the same as the first embodiment.

However, in the block region 717 of the feature according to this embodiment, the conductivity is extremely degraded for the above described reason, and especially a junction 719 is formed between the block region 717 and other base region 707, (FIG. 24(A)).

On the other hand, in the selected (ON) state, the base region 707 except the block region 717 is inverted by a voltage applied to the gate electrode 709, that is, the base region 707 except the block region 717 becomes the same conductivity type as the floating island regions 703 to 705. Thus, the drain current crosses the floating island regions and flows. Accordingly, in the selected state, the size of the substantial channel is almost equal to the size of the apparent channel. However, even in this case, since the conductivity is not changed in the block region, the drain current does not cross the block region (FIG. 24(B)).

As described above, this embodiment is characterized in that the substantial channel (path of a current) is greatly changed between the selected state and the non-selected state. Thus, the ON/OFF ratio can be made large.

The ON/OFF ratio can be further improved by increasing the value of W/L. According to this, the substantial channel length is increased in the non-selected state, while the channel width is increased in the selected state, so that the leak current is decreased and the drain current is increased. In this way, the substantial channel length in the non-selected state can be made 5 to 50 times as large as that in the selected state, and the substantial channel width can be made 1/2 to 1/10 times as large as that in the selected state. As a result, the ON/OFF ratio can be enlarged up to 700 times.

Figure 24C:
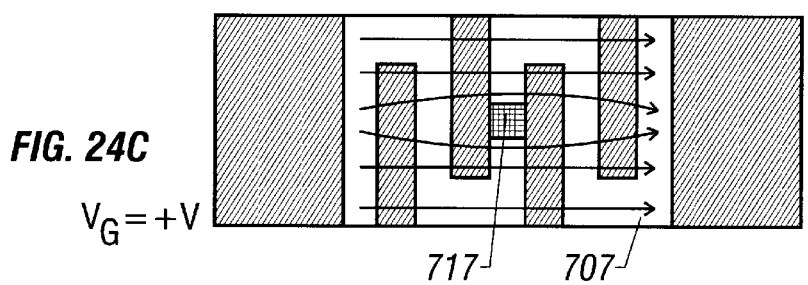

When the area occupied by the block area 717 is large, the flow of the drain current at the selected state is blocked. Thus, it is preferable if the area is smaller. This is apparent from the comparison between FIG. 24(B) and FIG. 24(C) where the area occupied by the block region 717 is small. (FIG. 24(C))

Figure 24D:
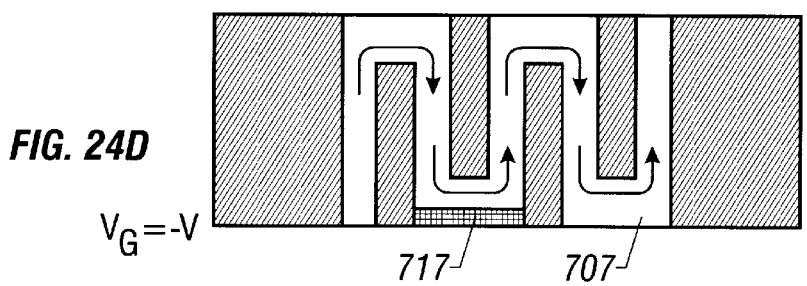
Figure 24E:
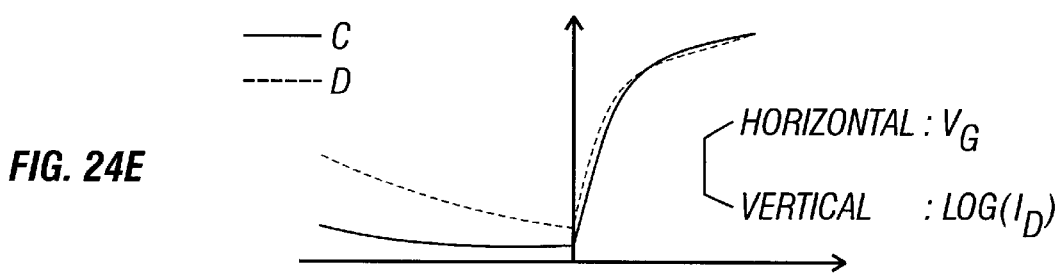

Also, even if the block region 717 is formed, if the block region does not have such structure as divides the base region 707 as shown in FIG. 24(D), the effect of decreasing the leak current when a large reverse bias voltage is applied to the gate electrode, as intended in this embodiment, is weakened as shown in FIG. 24(E). In this case, it should be noted that characteristics at the selected state is almost equal to each other. This is because the block region mainly functions in the non-selected state (FIG. 24(D), FIG. 24(E)).

[Embodiment 18]

Figure 25A:
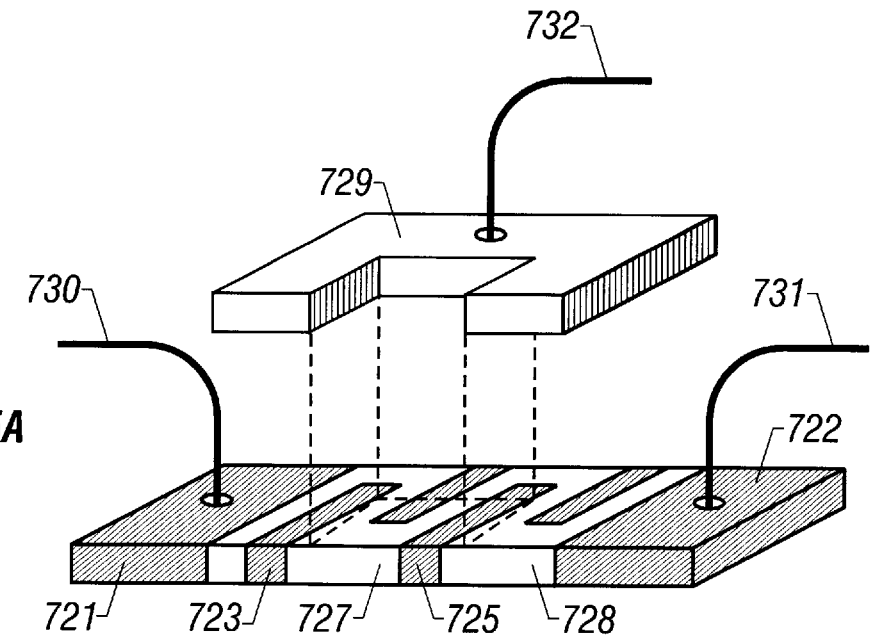
FIGS. 25(A) and 25(B) are views showing an operation of a semiconductor device of Embodiment 18.
Figure 25B:
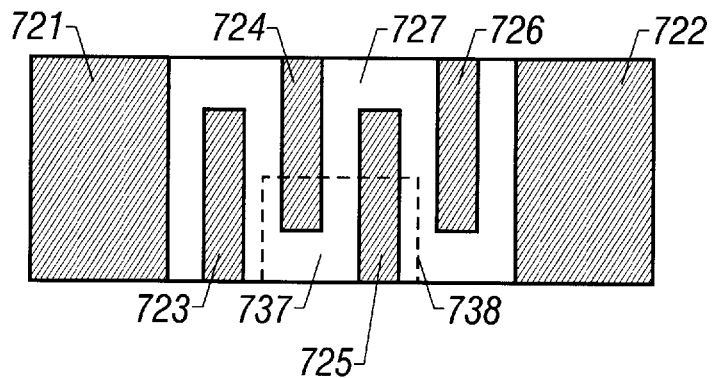

FIG. 25(A) is a schematic structural view according to this embodiment in which a block region of the feature of this embodiment is provided in the device of FIG. 1. FIG. 25(B) is a top view of a thin film semiconductor.

The thin film semiconductor 728 is doped with impurities to form source/drain regions 721 and 722, and floating island regions 723 to 726. On the other hand, a base region 727 is not doped so that the conductivity type of the base region 727 is intrinsic.

A gate electrode 729 is formed on the thin film semiconductor 728 through a gate insulating film not shown.

By removing a part of the gate electrode 729 after doping, a block region is formed in the base region 727. Also, from the definition of the block region, a portion of the base region 727 in the region surrounded by a dotted line 738 in FIG. 25(B), becomes the block region 737.

Further, a source wiring/electrode 730 is formed in the source region 721, and a drain wiring/electrode 731 is formed in the drain region 722. The gate electrode 729 is directly electrically connected to a gate wiring 732.

[Embodiment 19]

This embodiment will be described with reference to FIGS. 26(A) to 26(F). In this embodiment, formation of a circuit including not only a transistor according to the present invention but also other transistors and wirings will be described.

The main manufacturing steps of the circuit are as follows.

1. Formation of a semiconductor active layer (thin film semiconductor), a gate insulating film, a gate electrode/wiring, and a gate electrode portion.
2. Doping and activation of doping impurities.
3. Selective removal of the gate electrode/wiring.
4. Film formation of an interlayer insulator.
5. Formation of contact holes to source and drain regions, and a contact hole to the gate wiring.

6. Formation of wirings using a conductive material (metal etc.) of an upper layer.

In this embodiment, as disclosed in Japanese Patent Unexamined Publication No. Hei. 6-291315, the surface of a metal gate electrode/wiring is subjected to anodic oxidation to form a gate electrode portion.

Figure 26A:
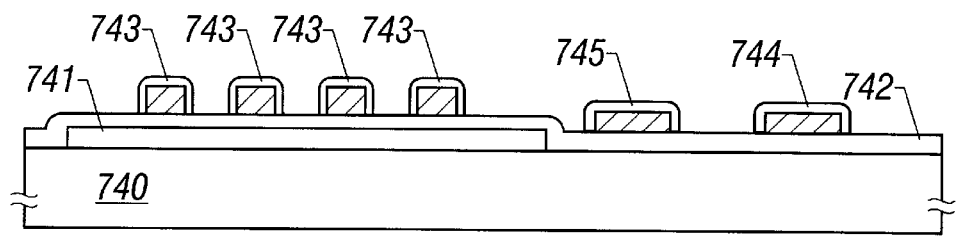
FIGS. 26(A) to 26(F) are views showing manufacturing steps of a semiconductor device of Embodiment 19.

First, step 1 will be described with reference to FIG. 26(A). The thin film semiconductor, gate insulating film, gate electrode/wiring and gate electrode portion are formed by a well-known technique or a technique disclosed in Japanese Patent Unexamined Publication No. Hei. 6-291315.

A thin film semiconductor 741 is formed on a substrate 740 having an insulating surface. As a material of the thin film semiconductor, single crystal silicon, polycrystal silicon, amorphous silicon or the like is used. The single crystal silicon includes: one obtained by epitaxial growth on a sapphire substrate; one obtained by a method (SIMOX method) in which high concentration oxygen ions are implanted into the center portion of a single crystal silicon wafer and the portion is oxidized to remain a single crystal silicon layer on only the surface of the wafer; and one obtained by various kinds of lateral epitaxial methods.

The polycrystal silicon includes: one obtained by vapor phase growth through well-known various kinds of film growth techniques; and one obtained by applying a laser annealing method, a lamp annealing method, a thermal annealing method or the like to the thus obtained polycrystal silicon or amorphous silicon to further improve the crystallinity.

A gate insulating film 742, gate electrodes 743, gate wirings 744 and 745 are formed so as to cover the thin film semiconductor 741. As the gate insulating film 742, a silicon oxide film obtained by a manufacturing method used in a normal semiconductor technique is preferable. The surfaces of the gate electrodes/wirings 743 to 745 are covered with an anodic oxidation material. Accordingly, it is necessary that the material of the gate electrodes/wirings 743 to 745 is such that an anodic oxidation film can be formed thereon. For example, a metal material mainly consisting of aluminum, tantalum and the like is preferable (FIG. 26(A)).

Figure 26B:
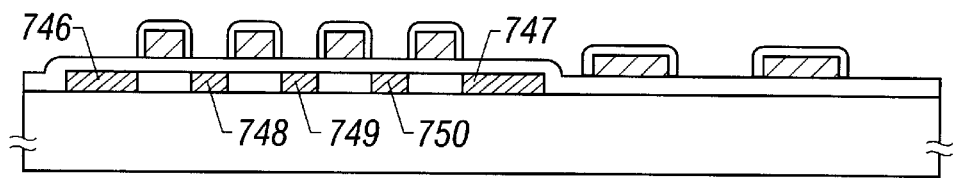

Next, step 2 will be described with reference to FIG. 26(B). This step is carried out by using a well-known impurity doping method. As a result that the gate electrode 743 functions as a mask, an n-type source region 746, a drain region 747, and floating island regions 748 to 750 are formed in a self-alignment manner, and at the same time, a region where doping is not carried out becomes a base region 751. Further, impurities introduced into the thin film semiconductor by doping are activated by a well-known method. For example, a thermal annealing method, a laser annealing method, a lamp annealing method or the like is adopted (FIG. 26(B)).

Figure 26C:
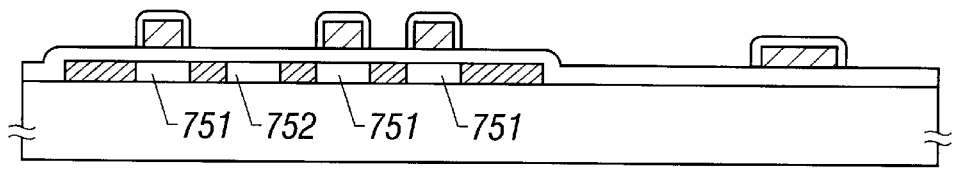

Next, step 3 will be described with reference to FIG. 26(C). In this step, the gate electrodes/wirings are selectively removed. That is, in the case where the wirings are subjected to anodic oxidation by an anodic oxidation technique as in this embodiment, it is necessary to supply a current to a portion where the anodic oxidation is carried out, by forming a wiring even at a portion which is originally unnecessary or unsuitable. After the completion of the anodic oxidation step, the wiring remaining at the unnecessary portion is removed. This step may be performed after or before doping. However, in this embodiment, since the gate electrode/wiring to form the block region is used as the doping mask, the removal of the wiring is required after the doping step. For this reason, a part of the gate electrodes 743 and the gate wiring 745 are removed (FIG. 26(C)). Accordingly, a region in the base region 751 where the gate electrode 743 is removed, becomes a block region 752.

Figure 26D:
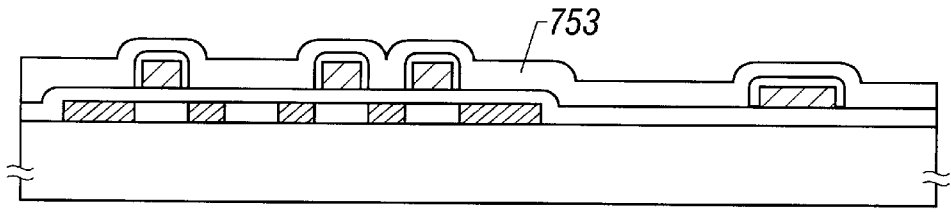

Next, step 4 will be described with reference to FIG. 26(D). This step is carried out by using a well-known interlayer insulator film forming technique. As a result, an interlayer insulator 753 is formed. A material of the interlayer insulator 753 is selected among materials used for a normal semiconductor technique. For example, silicon oxide or silicon nitride is preferable (FIG. 26(D)).

Figure 26E:
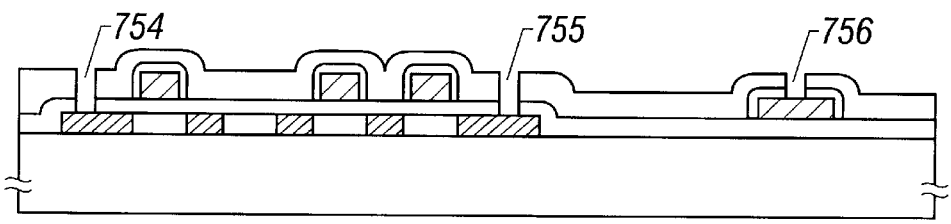

Next, step 5 will be described with reference to FIG. 26(E). This step is carried out by using a well-known contact hole forming technique. As a result, contact holes 754 to 756 to the source region 746, the drain region 747, and the gate wiring 744 are formed.

In the formation of the contact holes 754 to 756, for example, at the formation of the contact hole 756 to the gate wiring 744, the interlayer insulator 753 and the anodic oxidation film around the gate wiring 744 must be etched, while in the formation of other contact holes 754 and 756, the interlayer insulator 753 and the gate insulating film 742 must be etched. Accordingly, etching steps for the contact holes 754, 755 and 756 may be carried out separately.

Figure 26F:
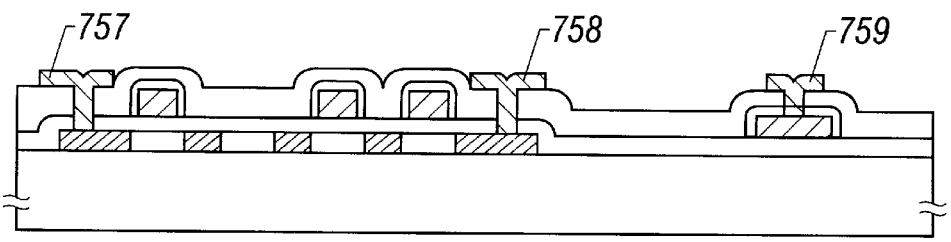

Next, step 6 will be described with reference to FIG. 26(F). This step is carried out by a well-known metal film forming technique and an etching technique. As a result, metal wirings 757 to 759 are formed (FIG. 26(F)).

The above steps are not applied to only a TFT disclosed in Japanese Patent Unexamined Publication No. Hei. 6-291315. As shown in FIGS. 12(C) and 12(D), it will be apparent that this embodiment can be practiced for a TFT in which an offset region or a low concentration impurity region is formed by using the anodic oxidation technique of a side surface as disclosed in Japanese Patent Unexamined Publication No. Hei. 7-169974.

The structure of the semiconductor device obtained in the above embodiment has the same concept as that shown in FIG. 23.

[Embodiment 20]

This embodiment will be described with reference to FIGS. 27(A) to 27(F). The main manufacturing steps of a transistor according to this embodiment are as follows.

1. Formation of a semiconductor active layer (thin film semiconductor).

2. Doping and activation of doping impurities.

3. Formation of a gate insulating film, and a gate electrode/wiring.

4. Formation of a low concentration impurity region by self-alignment doping using the gate electrode as a mask.

5. Selective removal of the gate electrode.

6. Formation of an interlayer insulator, contact holes and wirings using a conductive material (metal etc.) of an upper layer.

Figure 27A:
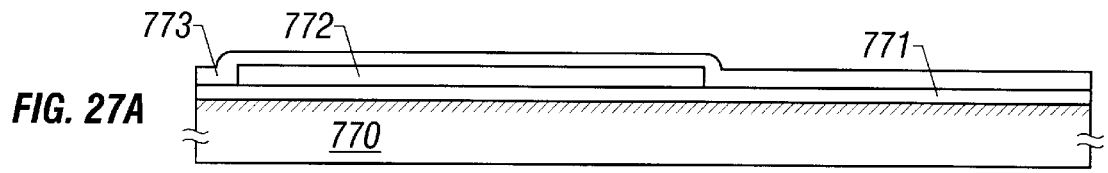
FIGS. 27(A) to 27(F) are views showing manufacturing steps of a semiconductor device of Embodiment 20.

First, step 1 will be described with reference to FIG. 27(A). A thin film semiconductor 772 is formed on a SIMOX substrate 770. The SIMOX substrate 771 is such a substrate that oxygen ions are implanted into a portion in the vicinity of a substrate of a single crystal silicon wafer only at a specified depth so that a silicon oxide layer 771 is formed near the surface of the substrate and a single crystal silicon layer remains thereon. Accordingly, the thin film semiconductor 772 can be formed simply by etching the single crystal silicon layer on the silicon oxide layer 771.

A gate insulating film 773 is formed so as to cover the thus obtained thin film semiconductor 772. In this embodiment, silicon oxide formed by a plasma CVD method is used as the gate insulating film 773 (FIG. 27(A)).

Figure 27B:
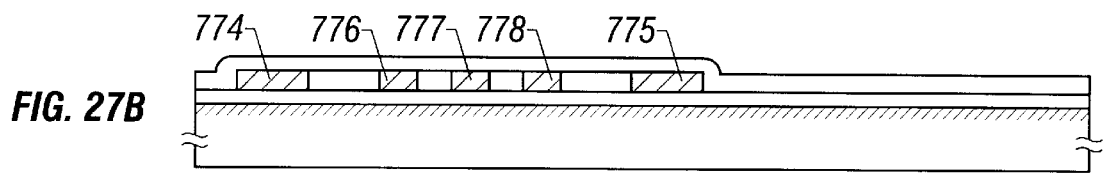

Next, step 2 will be described with reference to FIG. 27(B). This step is carried out by using a well-known impurity doping method. However, contrary to the case of Embodiment 19 (gate electrode 209 also serves as a mask for doping), a separate mask for doping is required. As a result, an n-type source region 774, a drain region 775, and floating island regions 776 to 778 are formed in a self-alignment manner. A region where doping is not carried out, becomes a base region 779. Further, impurities introduced into the thin film semiconductor by doping are activated by a well-known method. In this embodiment, a thermal annealing method is adopted (FIG. 27(B)).

In this way, in addition to the doped regions, the base region 779 which is not doped is formed.

Figure 27C:
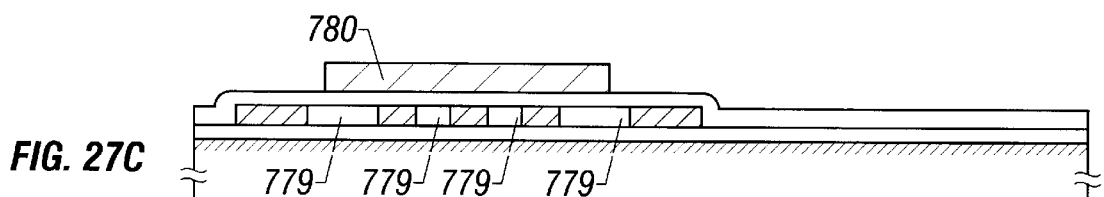

Next, step 3 will be described with reference to FIG. 27(C). In this step, by a well-known metal film forming technique and an etching technique, a gate electrode 780 is formed on the gate insulating film 773. In this embodiment, aluminum (containing 0.1 to 2% silicon) is used as the gate electrode 780 (FIG. 27(C)).

Figure 27D:
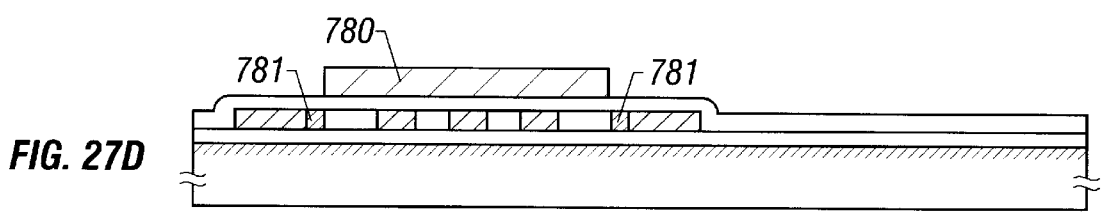

Next, step 4 will be described with reference to FIG. 27(D). This step is also carried out by using a well-known doping technique. However, the concentration of doping impurity is lower than that for the source/drain regions 774 and 775. In this doping, the gate electrode 780 is used as a mask for doping. In this way, a low concentration impurity region 781 is obtained. The doping impurities are activated by such a method (for example, a laser annealing method using an excimer laser) as does not impart damage to the gate electrode 780 (FIG. 27(D)).

Figure 27E:
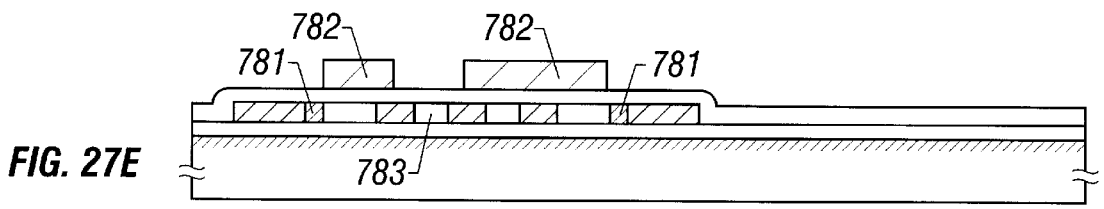

Next, step 5 will be described with reference to FIG. 27(E). This step is carried out by a well-known etching technique. A part of the gate electrode 780 is selectively etched by this step. As a result, a block region 783 which is the base region 779 but on which the gate electrode 780 is not provided, is formed (FIG. 27(E)).

Figure 27F:
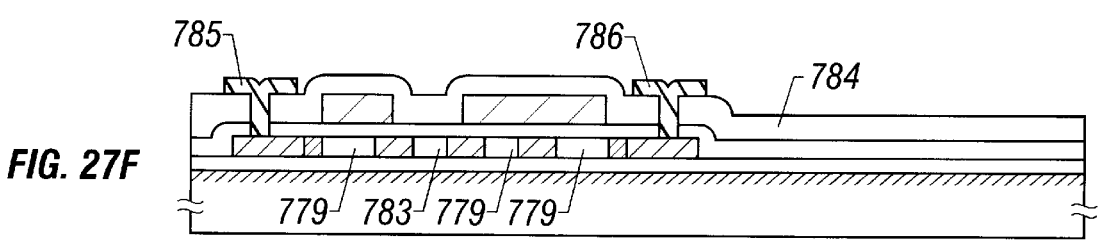

Next, step 6 will be described with reference to FIG. 27(F). This step is carried out by using a well-known interlayer insulator film forming method, a contact hole forming technique, a metal film forming technique, and an etching technique. As a result, an interlayer insulator 784, and metal wirings 785 and 786 are formed (FIG. 27(F)).

[Embodiment 21]

This embodiment will be described with reference to FIG. 28. A transistor according to this embodiment is of a so-called top gate type in which a gate electrode is disposed on a thin film semiconductor. However, contrary to Embodiments 19 and 20, the transistor according to this embodiment is of a type (positive stagger type) in which a source electrode/wiring, and a drain electrode/wiring are disposed beneath the thin film semiconductor, that is, are disposed opposite to the gate electrode. The main manufacturing steps of a semiconductor device according to this embodiment are as follows.

1. Formation of a source electrode/wiring, a drain electrode/wiring, and a semiconductor active layer (thin film semiconductor).
2. Formation of a gate insulating film and a gate electrode.
3. Doping and activation of doping impurities.
4. Selective removal of the gate electrode.

Figure 28A:
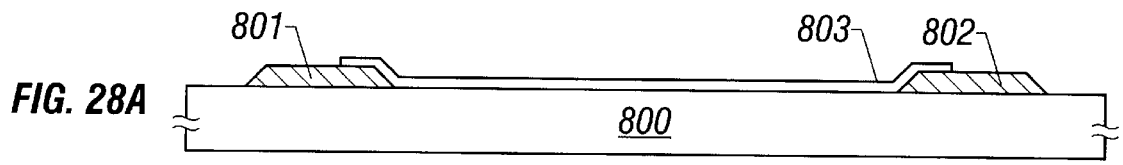
FIGS. 28(A) to 28(D) are views showing manufacturing steps of a semiconductor device of Embodiment 21.
Figure 28B:
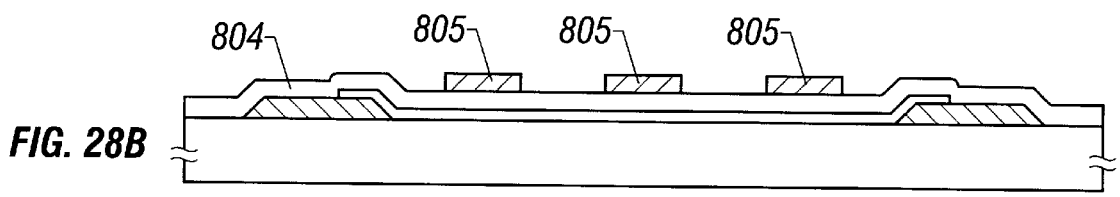
Figure 28C:
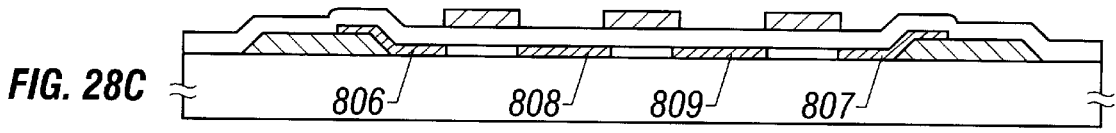
Figure 28D:
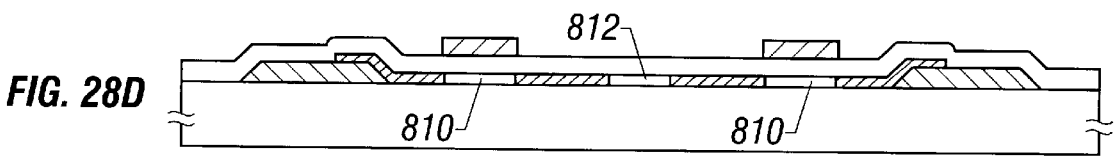

First, step 1 will be described with reference to FIG. 28(A). A source electrode/wiring 801 and a drain electrode/wiring 802 are formed on a glass substrate 800. Molybdenum is used as the source electrode/wiring 801 and the drain electrode/wiring 802. Other relatively high refractory metal (tungsten, chromium, tantalum, nickel etc.) may be used. Further, an amorphous silicon film 803 is formed thereon and is crystallized by a laser annealing method (FIG. 28(A)).

Next, step 2 is carried out. In this step, a gate insulating film 804 of silicon oxide and gate electrodes 805 of aluminum are formed by a well-known film forming technique (FIG. 28(B)).

Next, step 3 is carried out. This step is carried out by a well-known impurity doping method. As a result, a source region 806, a drain region 807, and floating island regions 808 and 809 are formed in a self-alignment manner. A region which is not doped becomes a base region 810. Further, the impurities introduced into the thin film semiconductor by doping are activated by a laser annealing method (FIG. 28(C)).

Next, step 4 is carried out. In this step, a part of the gate electrodes 805 is selectively removed by a well-known etching technique. As a result, a region of the base region 810 where the gate electrode 805 is removed, becomes a block region 812 (FIG. 28(D)).

[Embodiment 22]

Figure 29A:
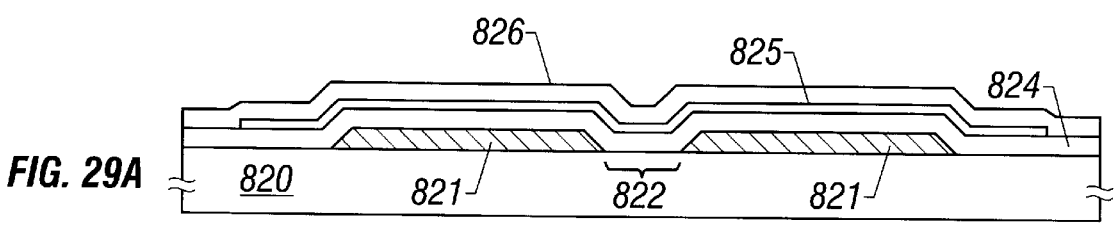
FIGS. 29(A) to 29(C) are views showing manufacturing steps of a semiconductor device of Embodiment 22.
Figure 29B:
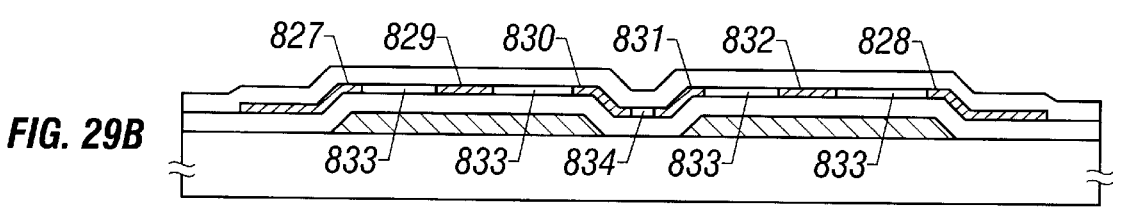
Figure 29C:
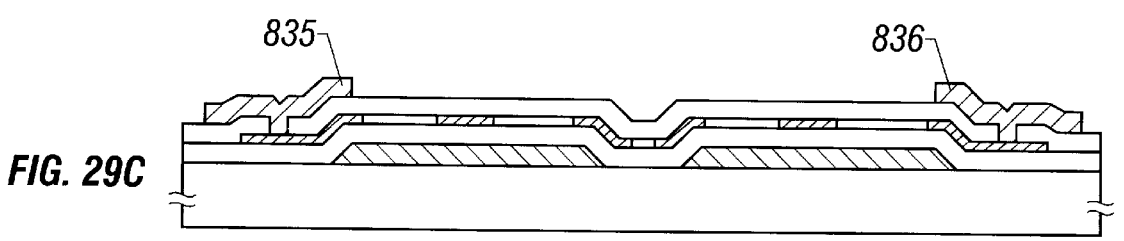

This embodiment will be described with reference to FIGS. 29(A) to 29(C). A transistor according to this embodiment is of a bottom gate type in which a gate electrode is positioned at the substrate side, contrary to Embodiments 19 to 21. The main manufacturing steps of a semiconductor device according to this embodiment are as follows.

1. Formation of a gate electrode/wiring, a gate insulating film, a semiconductor active layer (thin film semiconductor) and an interlayer insulator.
2. Doping and activation of doping impurities.
3. Formation of contact holes to source and region regions, and formation of wirings using a conductive material (metal etc.) of an upper layer.

Figure 30A:
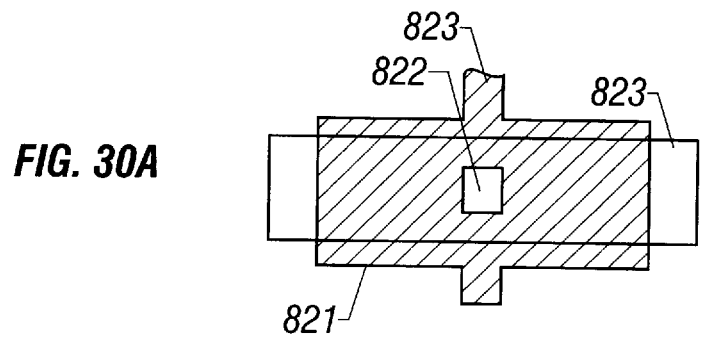
FIGS. 30(A) and 30(B) are top views showing the semiconductor device of Embodiment 22.

First, step 1 will be described with reference to FIG. 29(A). Gate electrodes 821 are formed on a glass substrate 820. Aluminum (containing 0.1 to 2% silicon) is used as the gate electrodes 821. FIG. 30(A) is a top view showing this state. All the gate electrodes 821 are obtained from the same film, which has a shape with a hole 822 at its center, and includes a terminal 823. (in order to increase a withstand voltage, an anodic oxidation film may be formed on an upper surface and a side surface of the gate electrode 821 by an anodic oxidation method.)

Further, a gate insulating film 824 of silicon oxide covering the gate electrodes 811 is formed, and a thin film semiconductor 825 of a polycrystal or amorphous silicon film, is formed on the gate insulating film 824. In this embodiment, the silicon oxide was formed by a reduced pressure CVD method, and the amorphous silicon film was formed by a plasma CVD method, which was crystallized by a laser annealing method. Further, a well-known insulating film forming technique, a silicon oxide film as an interlayer insulator 826 is formed so as to cover the thin film semiconductor 825 (FIG. 29(A)).

Next, step 2 will be described. This step is carried out by using a well-known doping technique. That is, a doping mask (not shown) is formed, and doping of a required concentration of phosphorus is carried out to form a source region 827, a drain region 828, floating island regions 829 to 832 in a self-alignment manner. Region of the thin film semiconductor 825 where phosphorus is not doped, become base regions 833 on the gate electrodes 821, and a block region 834 on the hole 822. Further, the impurities introduced into the thin film semiconductor by doping are activated by a lamp annealing method (FIG. 29(B)).

Figure 30B:
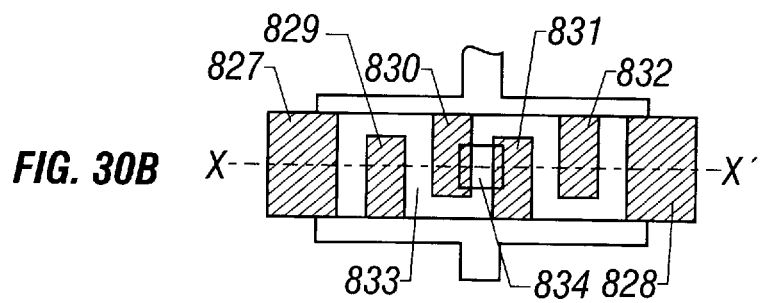

FIG. 30(B) is a top view showing the transistor in this state seen from the above. FIG. 29(C) is a sectional view taken along line X—X' in FIG. 30(B).

As shown in FIG. 30(B), the base region 833 has such a shape as is divided by the block region 834.

Next, step 3 will be described with reference to FIG. 29(C). This step is carried out by using a well-known contact hole forming technique, a metal film forming technique, and an etching technique. The interlayer insulator 826 is etched to form contact holes to the source region 827 and the drain region 828. Further, a source electrode/wiring 835 and a drain electrode/wiring 836 are formed (FIG. 29(C)).

[Embodiment 23]

This embodiment will be described with reference to FIGS. 31(A) and 31(B). A transistor according to this embodiment is also of a bottom gate type like Embodiment 22. Since the method of manufacturing the transistor is the same as Embodiment 22, the explanation thereof will be omitted here. The different point between this embodiment and Embodiment 22 is only a circuit arrangement such as a shape of a gate electrode and doping portions.

Figure 31A:
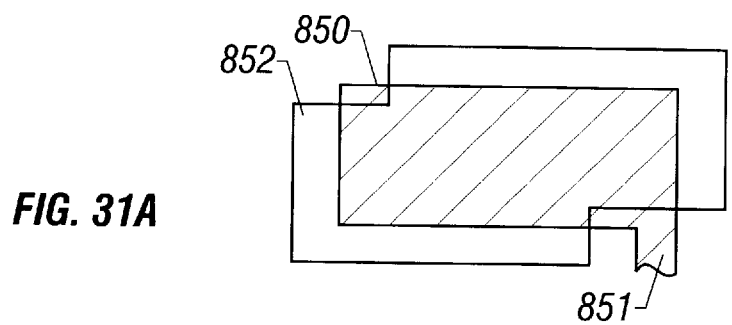
FIGS. 31(A) and 31(B) are views showing a semiconductor device of Embodiment 23.
Figure 31B:
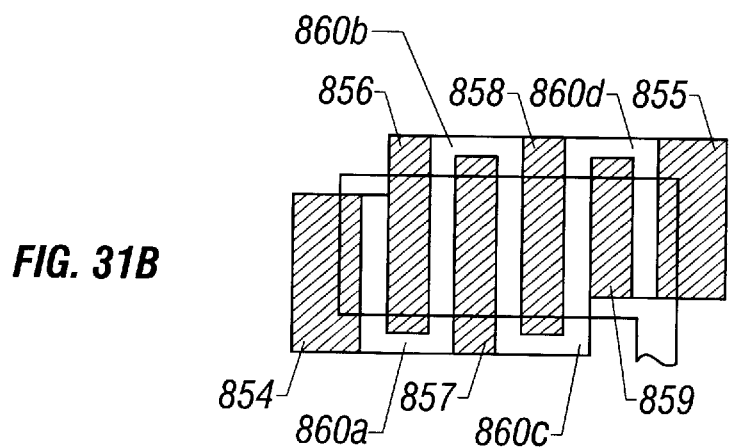
Figure 32:
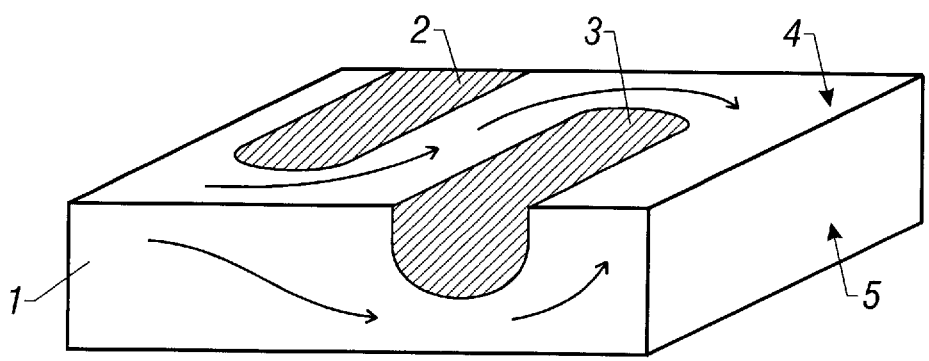
FIG. 32 is an explanatory view showing a concept of the present invention.

FIGS. 31(A) and 31(B) are top views showing the transistor according to this embodiment seen from the above. A gate electrode 850 has a plate-like shape with a terminal 851. On the other hand, a thin film semiconductor 852 has such a shape that it protrudes from the gate electrode in all directions (FIG. 31(A)).

FIG. 31(B) shows the state of portions where phosphorus is doped. That is, a source region 854 and a drain region 855 are provided at both ends of the thin film semiconductor 852, and floating island regions 856 to 859 are provided in the inside thereof. Also, a base region not shaded in the drawing is provided at the same time. In this embodiment, a plurality of block regions are formed on the outer circumference of the gate electrode 850. That is, four block regions 860a to 860d are formed (FIG. 31(B)).

Although the explanation of this embodiment relates to the bottom gate type, this embodiment can be practiced in the same manner even for a top gate type. Specifically, as shown in Embodiment 20, this embodiment is effective for a type in which non-self-alignment doping is carried out.

Conventionally, as a method of decreasing a leak current, there is known a method of arranging TFTs in series (for example, Japanese Patent Publication No. Hei. 5-44195 and No. Hei. 5-44196). However, this method has a problem that since two TFTs are arranged in series in the selected state, an extracted current is half of that for a case of one TFT. Since the present invention has not such a structure that semiconductor devices are connected in series, the invention does not suffer from the above problem.

According to the present invention, it becomes possible to decrease the leak current in the non-selected state of the thin film semiconductor device. However, since the drain current in the selected state is comparable to a conventional one, the ON/OFF ratio can be increased. The thin film semiconductor device according to the present invention is especially preferable for use in which a high ON/OFF ratio and a dynamic operation is required, for example, a transistor for controlling a picture element in an active matrix circuit of a liquid crystal display, which requires a low leak current between a source region and a drain region.

As described above, the present invention is useful in technology.

What is claimed is:

1. A thin film semiconductor device including at least a thin film semiconductor, a gate insulating film, and a gate electrode, comprises:

a semiconductor island-like shape which has an outer perimeter including a first outer edge and a second outer edge;

a source region having a first conductivity type to which a source electrode/wiring is connected;

a drain region having said first conductivity type to which a drain electrode/wiring is connected;

a base region being intrinsic or having a conductivity type opposite to said first conductivity type and disposed between said source region and said drain region;

a first floating island region having said first conductivity type and surrounded by said base region and said first outer edge; and a second floating island region having said first conductivity type and surrounded by said base region and said second outer edge; wherein:

said gate electrode is provided above or under said base region through said gate insulating film; and each of said first and second outer edges being defined by a line or a curve connecting said source region to said drain region.

2. A thin film semiconductor device including at least a thin film semiconductor, a gate insulating film, and a gate electrode, comprises:

an island-like shape which is separately formed;

a source region having a first conductivity type and to which a source electrode/wiring is connected;

a drain region having said first conductivity type and to which a drain electrode/wiring is connected;

a base region being intrinsic or having a conductivity type opposite to said first conductivity type and disposed between said source region and said drain region; and a floating island region having said first conductivity type and separated from said source region and said drain region by said base region; wherein:

said gate electrode is provided above or under said base region through said gate insulating film; and a shortest distance from said source region to said drain region via only said base region is larger than a shortest distance from said source region to said drain region via said base region and said floating island region.

3. A thin film semiconductor device including at least a thin film semiconductor, a gate insulating film, and a gate electrode, comprises:

an island-like shape which is separately formed;

a source region having a first conductivity type and to which a source electrode/wiring is connected;

a drain region having said first conductivity type and to which a drain electrode/wiring is connected;

a base region being intrinsic or having a conductivity type opposite to said first conductivity type and being continuous with said drain region from said source region; and a floating island region having said first conductivity type and separated from said source region and said drain region by said base region; wherein:

said gate electrode is provided above or under said base region through said gate insulating film.

4. A thin film semiconductor device including at least a thin film semiconductor, a gate insulating film, and a gate electrode, comprises:

an island-like shape which is separately formed;

a source region having a first conductivity type and to which a source electrode/wiring is connected;

a drain region having said first conductivity type and to which a drain electrode/wiring is connected;

only one base region being intrinsic or having a conductivity type opposite to said first conductivity type;

a floating island region having said first conductivity type and separated from said source region and said drain region by said base region; wherein:

said gate electrode is provided above or under said base region through said gate insulating film.

5. A thin film semiconductor device including at least a thin film semiconductor, a gate insulating film, and a gate electrode, comprises:

an island-like shape which is separately formed;

a source region having a first conductivity type and to which a source electrode/wiring is connected;

a drain region having said first conductivity type and to which a drain electrode/wiring is connected;

a base region being intrinsic or having a conductivity type opposite to said first conductivity type and being continuous with said drain region from said source region; and a floating island region having said first conductivity type and separated from said source region and said drain region by said base region; wherein:

said gate electrode is provided above or under said base region through said gate insulating film; and wherein a value obtained by dividing an area of said base region by a shortest distance from said source region to said drain region via only said base region is smaller than a value obtained by dividing an area of said thin film semiconductor except said source region and said drain region by a shortest distance from said source region to said drain region.

6. A thin film semiconductor device as claimed in claim 3, wherein an average width of a path leading on said base region from said source region to said drain region is smaller than the average width of a path leading on said thin film semiconductor from said source region to said drain region.

7. A thin film semiconductor device as claimed in any one of claims 1 to 5, wherein said floating island region is formed by diffusing impurities which cause said first conductivity type.

8. A thin film semiconductor device as claimed in any one of claims 1 to 5, wherein said thin film semiconductor includes a first main surface and a second main surface, and said floating island region has a surface included in said first main surface and a surface included in said second main surface.

9. A thin film semiconductor device as claimed in any one of claims 1 to 5, wherein said base region has a shape substantially equal to the shape of said gate electrode upper or under said thin film semiconductor.

10. A thin film semiconductor device as claimed in any one of claims 1 to 5, wherein said source region, said drain region, and said floating island region are formed by a self-alignment impurity doping method using said gate electrode as a mask.

11. A thin film semiconductor device as claimed in any one of claims 1 to 5, further comprising a region disposed at a border portion between said floating island region and said base region, and containing impurities with said first conductivity type and a concentration lower than said floating island region.

12. A thin film semiconductor device including at least a thin film semiconductor, a gate insulating film, and a gate electrode, comprises:

a source region having a first conductivity type and to which a source electrode/wiring is connected;

a drain region having said first conductivity type and to which a drain electrode/wiring is connected;

a base region being intrinsic or having a conductivity type opposite to said first conductivity type and disposed between said source region and said drain region;

floating island regions having said first conductivity type and separated from said source region and said drain region by said base region; and an overlap gate electrode formed upper or under at least one of said floating island regions; wherein:

said gate electrode is provided above or under said base region through said gate insulating film;

said source region, said drain region, and said floating island regions are formed by diffusion of impurities using said gate electrode as a mask; and a shortest distance from said source region to said drain region via only said base region is larger than a shortest distance from said source region to said drain region through said base region and said floating island region.

13. A thin film semiconductor device including at least a thin film semiconductor, a gate insulating film, and a gate electrode, comprises:

a source region having a first conductivity type and to which a source electrode/wiring is connected;

a drain region having of said first conductivity type and to which a drain electrode/wiring is connected;

a base region being intrinsic or having a conductivity type opposite to said first conductivity type and being continuous with said drain region from said source region;

floating island regions having said first conductivity type and separated from said source region and said drain region by said base region; and an overlap gate electrode formed upper or under at least one of said floating island regions; wherein:

said gate electrode is provided above or under said base region through said gate insulating film; and said source region, said drain region, and said floating island region are formed by diffusion of impurities using said gate electrode as a mask.

14. A thin film semiconductor device including at least a thin film semiconductor, a gate insulating film, and a gate electrode, comprises:

a source region having a first conductivity type and to which a source electrode/wiring is connected;

a drain region having said first conductivity type and to which a drain electrode/wiring is connected;

only one base region being intrinsic or having a conductivity type opposite to said first conductivity type;

floating island regions having said first conductivity type and separated from said source region and said drain region by said base region; and an overlap gate electrode formed upper or under at least one of said floating island regions; wherein:

said gate electrode is provided above or under said base region through said gate insulating film; and said source region, said drain region, and said floating island region are formed by diffusion of impurities using said gate electrode as a mask.

15. A thin film semiconductor device including at least a thin film semiconductor, a gate insulating film, and a gate electrode, comprises:

a source region having a first conductivity type and to which a source electrode/wiring is connected;

a drain region having said first conductivity type and to which a drain electrode/wiring is connected;

a base region being intrinsic or having a conductivity type opposite to said first conductivity type and being continuous with said drain region from said source region;

floating island regions having said first conductivity type and separated from said source region and said drain region by said base region; and an overlap gate electrode formed upper or under at least one of said floating island region; wherein:

said gate electrode is provided above or under said base region through said gate insulating film;

said source region, said drain region, said floating island regions are formed by diffusion of impurities using said gate electrode as a mask; and a value obtained by dividing an area of said base region by a shortest distance from said source region to said drain region via only said base region is smaller than a value obtained by dividing an area of said thin film semiconductor except said source region and said drain region by a shortest distance from said source region to said drain region.

16. A thin film semiconductor device as claimed in claim 13, wherein an average width of a path leading on said base region from said source region to said drain region is smaller than the average width of a path leading on said thin film semiconductor from said source region to said drain region.

17. A thin film semiconductor device as claimed in any one of claims 12 to 15, further comprising a region disposed at a border portion between said floating island regions and said base region, and containing impurities with said first conductivity type and with a concentration lower than said floating island regions.

18. A thin film semiconductor device as claimed in any one of claims 12 to 15, wherein a forward bias voltage is applied to said overlap gate electrode.

19. A thin film semiconductor device including at least an island-like thin film semiconductor, a gate insulating film, and a gate electrode, comprises:

a source region having a first conductivity type and to which a source electrode/wiring is connected;

a drain region having said first conductivity type and to which a drain electrode/wiring is connected;

a base region being intrinsic or having a conductivity type opposite to said first conductivity type and disposed between said source region and said drain region; and a floating island region having said first conductivity type and separated from said source region and said drain region by said base region; wherein:

said gate electrode is provided above or under said thin film semiconductor through said gate insulating film;

said base region includes at least one block region not overlapping with said gate electrode;

a shortest distance from said source region to said drain region via only said base region is larger than a shortest distance from said source region to said drain region via said base region and said floating island region; and a path leading from said source region to said drain region via only said base region always passes through said block region.

20. A thin film semiconductor device including at least an island-like thin film semiconductor, a gate insulating film, and a gate electrode, comprises:

a source region having a first conductivity type and to which a source electrode/wiring is connected;

a drain region having said first conductivity type and to which a drain electrode/wiring is connected;

a base region being intrinsic or having a conductivity type opposite to said first conductivity type and being continuous with said drain region from said source region; and a floating island region having said first conductivity type and separated from said source region and said drain region by said base region; wherein:

said gate electrode is provided above or under said thin film semiconductor through said gate insulating film;

said base region includes at least one block region not overlapping with said gate electrode; and a path leading from said source region to said drain region via only said base region always passes through said block region.

21. A thin film semiconductor device including at least an island-like thin film semiconductor, a gate insulating film, and a gate electrode, comprises:

a source region having a first conductivity type and to which a source electrode/wiring is connected;

a drain region having said first conductivity type and to which a drain electrode wiring is connected;

only one base region being intrinsic or having a conductivity type opposite to said first conductivity type; and a floating island region having said first conductivity type and separated from said source region and said drain region by said base region; wherein:

said gate electrode is provided above or under said thin film semiconductor through said gate insulating film;

said base region includes at least one block region not overlapping with said gate electrode; and a path leading from said source region to said drain region via only said base region always passes through said block region.

22. A thin film semiconductor device including at least an island-like thin film semiconductor, a gate insulating film, and a gate electrode, comprises:

a source region having a first conductivity type and to which a source electrode/wiring is connected;

a drain region having said first conductivity type and to which a drain electrode/wiring is connected;

a base region being intrinsic or having a conductivity type opposite to said first conductivity type and being continuous with said drain region from said source region; and a floating island region having said first conductivity type and separated from said source region and said drain region by said base region; wherein:

said gate electrode is provided above or under said thin film semiconductor through said gate insulating film;

said base region includes at least one block region not overlapping with said gate electrode;

a value obtained by dividing an area of said base region by a shortest distance from said source region to said drain region via only said base region is smaller than a value obtained by dividing an area of said thin film semiconductor except said source region and said drain region by a shortest distance from said source region to said drain region; and a path leading from said source region to said drain region via only said base region always passes through said block region.

23. A thin film semiconductor device including at least an island-like thin film semiconductor, a gate insulating film, and a gate electrode, comprises:

a source region having a first conductivity type and to which a source electrode/wiring is connected;

a drain region having said first conductivity type and to which a drain electrode/wiring is connected;

only one base region being intrinsic or having a conductivity type opposite to said first conductivity type; and a floating island region having said first conductivity type and separated from said source region and said drain region by said base region; wherein:

said gate electrode is provided above or under said thin film semiconductor through said gate insulating film;

wherein said base region includes at least one block region not overlapping with said gate electrode; and said block region is provided so as to divide said base region.

24. A thin film semiconductor device as claimed in claim 20, wherein an average width of a path leading on said base region from said source region to said drain region is smaller than the average width of a path leading on said thin film semiconductor from said source region to said drain region.

25. A thin film semiconductor device as claimed in any one of claims 19 to 23, wherein said floating island region is formed by diffusion of impurities which cause said first conductivity type.

26. A thin film semiconductor device as claimed in any one of claims 19 to 23, wherein said thin film semiconductor includes a first main surface and a second main surface, and said floating island region has a surface included in said first main surface and a surface included in said second main surface.

27. A thin film semiconductor device as claimed in any one of claims 19 to 23, wherein said base region except said block region has a shape substantially equal to the shape of said gate electrode upper or under said thin film semiconductor.

28. A thin film semiconductor device as claimed in any one of claims 19 to 23, wherein said source region, said drain region, and said floating island region are formed by a self-alignment impurity doping method.

29. A thin film semiconductor device as claimed in any one of claims 19 to 23, further comprising a region disposed at a border portion between said floating island region and said base region and containing impurities with said first conductivity type and a concentration lower than said floating island region.

\* \* \* \* \*